US009601339B2

(12) United States Patent
Fu et al.

(10) Patent No.: US 9,601,339 B2
(45) Date of Patent: Mar. 21, 2017

(54) METHODS FOR DEPOSITING FLUORINE/CARBON-FREE CONFORMAL TUNGSTEN

(71) Applicant: Applied Materials, Inc., Santa Clara, CA (US)

(72) Inventors: Xinyu Fu, Pleasanton, CA (US); Srinivas Gandikota, Santa Clara, CA (US); Avgerinos V. Gelatos, Redwood City, CA (US); Atif Noori, Saratoga, CA (US); Mei Chang, Saratoga, CA (US); David Thompson, San Jose, CA (US); Steve G. Ghanayem, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/965,349

(22) Filed: Dec. 10, 2015

(65) Prior Publication Data
US 2016/0104624 A1   Apr. 14, 2016

Related U.S. Application Data

(63) Continuation of application No. 14/062,804, filed on Oct. 24, 2013, now Pat. No. 9,230,815.
(Continued)

(51) Int. Cl.
*H01L 21/285* (2006.01)
*H01L 21/768* (2006.01)
(Continued)

(52) U.S. Cl.
CPC ........ *H01L 21/28562* (2013.01); *C23C 16/06* (2013.01); *C23C 16/14* (2013.01); *C23C 16/4557* (2013.01); *C23C 16/45525* (2013.01); *C23C 16/45551* (2013.01); *C23C 16/45563* (2013.01); *C23C 16/45565* (2013.01); *C23C 16/45574* (2013.01); *H01L 21/28088* (2013.01);
(Continued)

(58) Field of Classification Search
CPC ............................ H01L 21/3141; C23C 16/14
See application file for complete search history.

(56) References Cited

U.S. PATENT DOCUMENTS 4,391,846 A   7/1983 Raymond
4,699,801 A   10/1987 Ito et al.
(Continued)

FOREIGN PATENT DOCUMENTS

JP   2008-131050     6/2008
JP   2008-131050 A   6/2008
(Continued)

OTHER PUBLICATIONS

PCT International Preliminary Report on Patentability in PCT/US2013/066866, mailed May 7, 2015, 14 pages.
(Continued)

*Primary Examiner* — Thanhha Pham
(74) *Attorney, Agent, or Firm* — Servilla Whitney LLC

(57) ABSTRACT

Provided are atomic layer deposition methods to deposit a tungsten film or tungsten-containing film using a tungsten-containing reactive gas comprising one or more of tungsten pentachloride, a compound with the empirical formula $WCl_5$ or $WCl_6$.

18 Claims, 14 Drawing Sheets

Related U.S. Application Data

(60) Provisional application No. 61/719,350, filed on Oct. 26, 2012, provisional application No. 61/784,281, filed on Mar. 14, 2013, provisional application No. 61/825,983, filed on May 21, 2013.

(51) Int. Cl.
*C23C 16/14* (2006.01)
*C23C 16/455* (2006.01)
*H01L 21/28* (2006.01)
*C23C 16/06* (2006.01)
*H01L 21/3205* (2006.01)

(52) U.S. Cl.
CPC .. *H01L 21/28506* (2013.01); *H01L 21/32051* (2013.01); *H01L 21/76877* (2013.01)

(56) References Cited

U.S. PATENT DOCUMENTS

| | | | |
|---|---|---|---|
| 6,242,045 B1 | 6/2001 | Proscia et al. | |
| 6,875,271 B2 | 4/2005 | Glenn et al. | |
| 7,674,710 B2 | 3/2010 | Ashigaki et al. | |
| 7,745,333 B2 | 6/2010 | Lai et al. | |
| 2004/0065255 A1 | 4/2004 | Yang et al. | |
| 2004/0214416 A1 | 10/2004 | Woo et al. | |
| 2006/0024959 A1 | 2/2006 | Li et al. | |
| 2009/0035941 A1 | 2/2009 | Park et al. | |
| 2010/0184294 A1 | 7/2010 | Park et al. | |
| 2012/0003833 A1 | 1/2012 | Khandelwal et al. | |
| 2012/0244699 A1 | 9/2012 | Khandelwal et al. | |
| 2013/0164445 A1* | 6/2013 | Kwong | C23C 16/448 427/255.5 |

FOREIGN PATENT DOCUMENTS

| | | |
|---|---|---|
| KR | 10-2009-001328 A | 2/2009 |
| KR | 10-2009-0013286 | 2/2009 |
| KR | 10-2010-0084207 | 7/2010 |
| KR | 10-2010-0084207 A | 7/2010 |

OTHER PUBLICATIONS

PCT International Search Report and Written Opinion in PCT/US2013/066866, mailed Feb. 25, 2014, 17 pages.

* cited by examiner

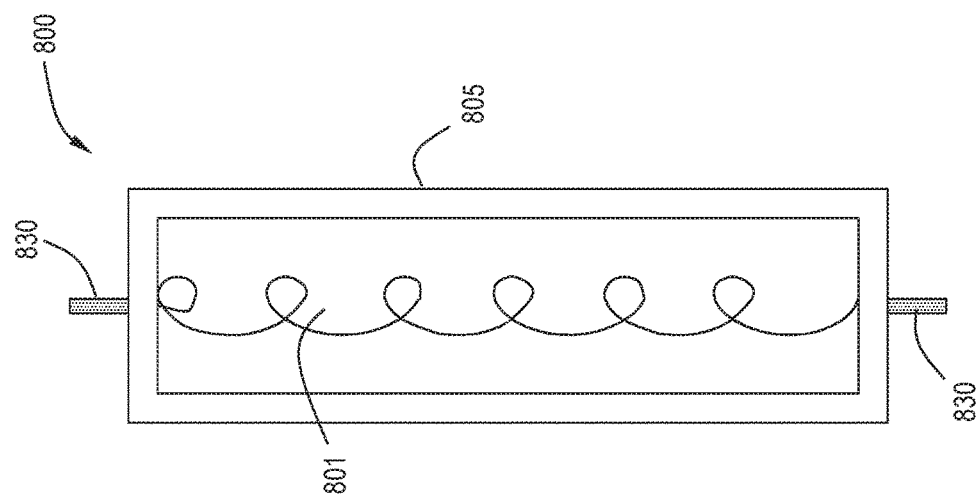
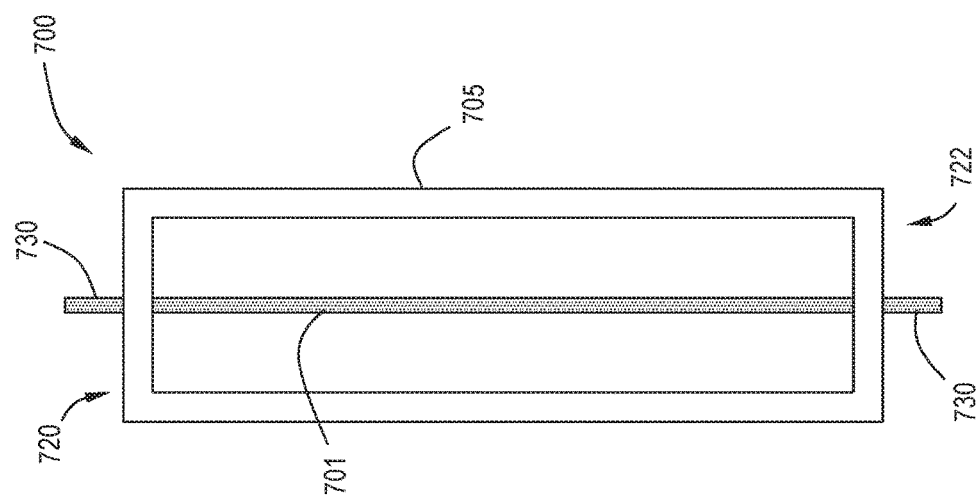

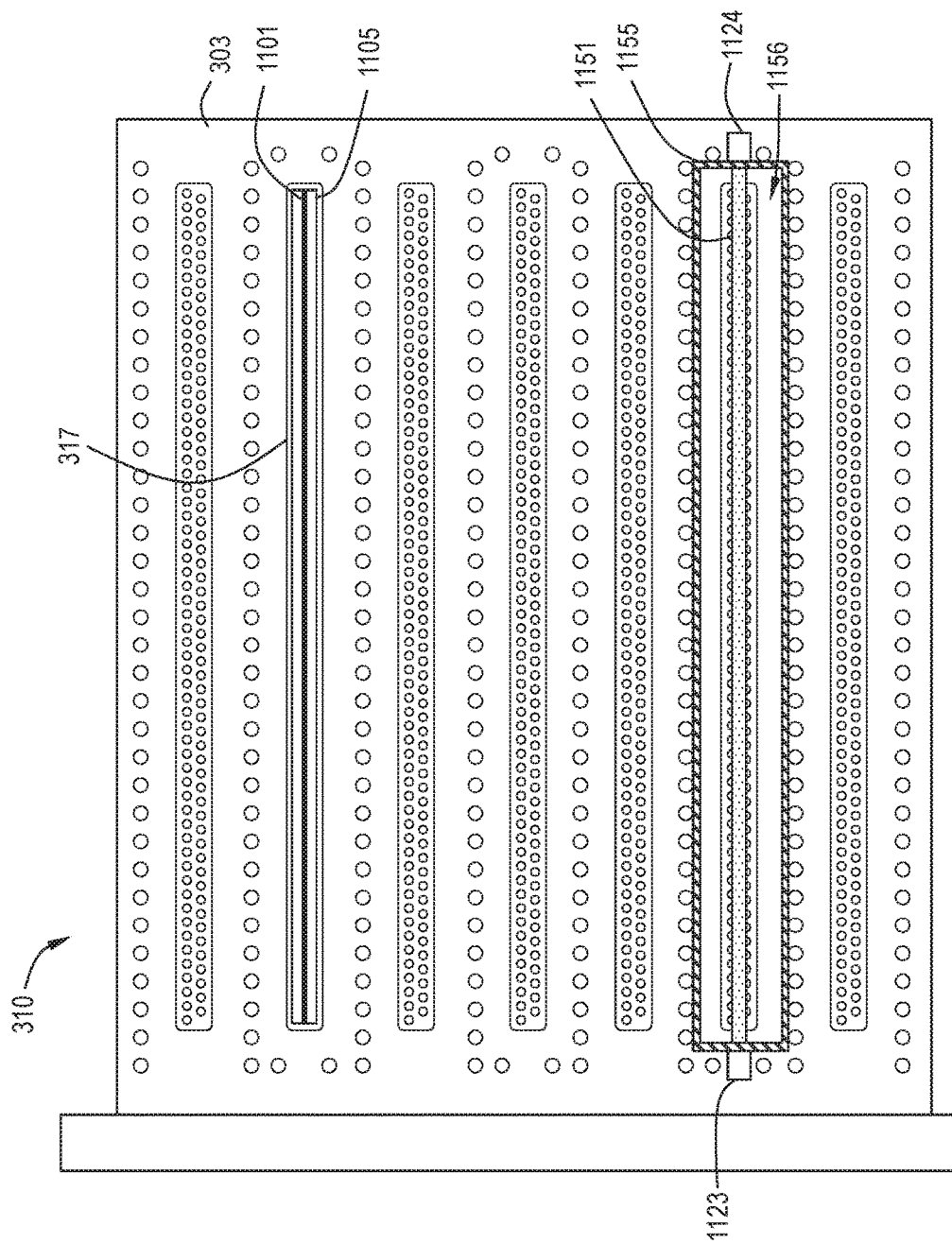

METHODS FOR DEPOSITING FLUORINE/CARBON-FREE CONFORMAL TUNGSTEN

CROSS-REFERENCE TO RELATED APPLICATIONS

This application is a continuation of U.S. patent application Ser. No. 14/062,804, filed Oct. 24, 2013, which claims priority to U.S. Provisional Application Nos. 61/719,350, filed Oct. 26, 2012, 61/784,281, filed Mar. 14, 2013 and 61/825,983, filed May 21, 2013.

BACKGROUND

Embodiments of the invention relate to the processing of semiconductor substrates. More particularly, embodiments of the invention relate to methods for the low temperature deposition of tungsten or tungsten silicide layers on semiconductor substrates using atomic layer deposition techniques.

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Formation of film layers at a high deposition rate while providing adequate step coverage are conflicting characteristics often necessitating the sacrifice of one to obtain the other. This conflict is true particularly when refractory metal layers are deposited over gaps or vias during the formation of contacts interconnecting adjacent metallic layers separated by dielectric layers. Historically, CVD techniques have been employed to deposit conductive material such as refractory metals in order to inexpensively and quickly form contacts. Due to the increasing integration of semiconductor circuitry, tungsten has been used based upon superior step coverage. As a result, deposition of tungsten employing CVD techniques enjoys wide application in semiconductor processing due to the high throughput of the process.

Depositing tungsten by conventional CVD methods, however, is attendant with several disadvantages. For example, ALD processes deposit tungsten films into vias containing high aspect ratios (e.g., 20), whereas conventional CVD processes will usually cause similar vias to "pinch-off" and not completely fill. Also, blanket deposition of a tungsten layer on a semiconductor wafer is time-consuming at temperatures below 400° C. The deposition rate of tungsten may be improved by increasing the deposition temperature to, for example, about 500° C. to about 550° C. However, temperatures in this higher range may compromise the structural and operational integrity of the underlying portions of the integrated circuit being formed. Use of tungsten has also frustrated photolithography steps during the manufacturing process as it results in a relatively rough surface having a reflectivity of 70% or less than that of silicon (thickness and wavelength dependent). Further, tungsten has proven difficult to deposit uniformly. Poor surface uniformity typically increases film resistivity.

In high-k metal gates with replacement gate scheme, the features that need to be filled are getting extremely small as the technology node goes to 20 nm and below. The conformality of the work function film and the property of such film (free of detrimental elements including fluorine) need to be well controlled. Additionally, it is desirable to combine a few functional layers (such as WF, nucleation, barrier layers), that have been used on larger structures, when developing film stacks for smaller features to due to the very limited real estate inside the smaller structures.

Tungsten and tungsten silicide ($WSi_x$) films that have been available are mostly $WF_6$ based CVD/ALD processes that introduce fluorine and cannot be directly deposited on the gate before barrier layer and nucleation layer have been deposited. Tungsten precursors with metal oxide ligands suffer from high carbon contents while other halide precursors, such as chlorides, are processed at high temperatures (600° C. and above) and is not suitable for the replacement gate process. The CVD process at high temperature also suffers from poorer step coverage.

Tungsten metal deposition processes can be performed by reaction with hydrogen. However, the reaction is severely limited by the dissociation of hydrogen. Hydrogen plasma can increase the reaction rate but can cause damage to the substrate or film being formed. Hydrogen radicals can also be reacted with tungsten precursors to form tungsten films. However, a "hot-wire" which is typically used to generate the radicals is incompatible with tungsten precursors.

Therefore, there is a need in the art for an improved techniques to deposit tungsten layers with good conformality using atomic layer deposition techniques.

SUMMARY

One or more embodiments of the invention are directed to processing methods comprising sequentially exposing a substrate to a first reactive gas comprising a tungsten-containing compound comprising a compound with the empirical formula $W_xCl_{5x}$ and a second reactive gas to form a tungsten-containing film.

Some embodiments of the invention are directed to processing methods. The methods comprise positioning a substrate in a processing chamber and sequentially exposing at least a portion of the substrate to a first reactive gas and a second reactive gas at a temperature less than or equal to about 475° C. to form a tungsten-containing film, the first reactive gas comprising one or more of tungsten pentachloride, a compound with the empirical formula $W_xCl_{5x}$ or tungsten hexachloride.

Some embodiments of the invention are directed to methods of depositing a $WSi_x$ film. The methods comprise positioning a substrate in a processing chamber; and sequentially exposing at least a portion of the substrate to a first reactive gas and a second reactive gas at a temperature less than or equal to about 475° C. to form the $WSi_x$ film. The first reactive gas comprises one or more of tungsten pentachloride, a compound with the empirical formula $W_xCl_{5x}$ or tungsten hexachloride and the second reactive gas comprises a silicon-containing gas, the ratio of the silicon-containing gas to the tungsten-containing gas in the range of about 100:2 and about 100:0.2.

Some embodiments of the invention are directed to processing methods comprising sequentially exposing at least a portion of substrate in a processing chamber to a first reactive gas comprising a tungsten-containing compound having the empirical formula $WCl_5$ or $WCl_6$ and a second reactive gas comprising hydrogen radicals to form a tungsten-containing film.

One or more embodiments of the invention are directed to processing method comprising positioning a substrate in a processing chamber comprising a gas distribution assembly including a plurality of elongate gas ports including a first reactive gas port and second reactive gas port, the first reactive gas port in fluid communication with a first reactive gas comprising a tungsten-containing compound with the empirical formula $WCl_5$ or $WCl_6$ and the second reactive gas port in fluid communication with a second reactive gas comprising hydrogen, the gas distribution assembly flowing both the first reactive gas and the second reactive gas into the processing chamber simultaneously. The second reactive gas is passed across a heating element to generate hydrogen radicals in the second reactive gas. At least a portion of the substrate is sequentially exposed to the first reactive gas and the hydrogen radicals in the second reactive gas to form a tungsten film on the substrate.

In some embodiments, the second reactive gas comprises a hydrogen-containing compound and the tungsten-containing film is a tungsten film. In some embodiments, the tungsten-containing film consists essentially of tungsten. In one or more embodiments, the second reactive gas comprises a nitrogen-containing compound and the tungsten-containing film comprises tungsten nitride. In some embodiments, the second reactive gas comprises a silicon-containing compound and the tungsten-containing film comprises tungsten silicide ($WSi_x$).

In some embodiments, the second reactive gas further comprises hydrogen. In one or more embodiments, the second reactive gas comprises a mixture of a silicon-containing compound and a nitrogen-containing compound and the tungsten-containing film comprises tungsten-silicon-nitride ($WSi_xN_y$).

In some embodiments, the substrate comprises a work function metal. In one or more embodiments, the work function metal comprises Ti and/or TiAl. In some embodiments, there is no intervening layer between the work function metal and the film consisting essentially of tungsten. In one or more embodiments, there is an intervening layer between the work function metal and the film consisting essentially of tungsten, the intervening layer having a thickness of less than about 5 Angstroms.

In some embodiments, prior to deposition of the tungsten-containing film, the substrate comprises an oxide layer and the method further comprises soaking the substrate with disilane or a mixture of hydrogen and silane at a partial pressure in the range of about 5 to about 20 Torr.

In some embodiments, the tungsten containing film grows at a rate in the range of about 0.2 Å/cycle and about 3 Å/cycle.

Some embodiments further comprise generating hydrogen radicals from hydrogen gas. In one or more embodiments, generating the hydrogen radicals from hydrogen gas comprises passing the hydrogen gas across a heating element having a temperature sufficient to create hydrogen radicals. Some embodiments further comprise comprising heating the heating element to the temperature sufficient to create hydrogen radicals. In some embodiments, heating the heating element comprises providing a flow of electrical current through the heating element. One or more embodiments, further comprise applying dynamic tension to ends of the heating element to prevent the heating element from sagging at the temperature sufficient to create hydrogen radicals.

In some embodiments, the heating element is contained within an enclosure substantially resistant to thermal expansion. In some embodiments, the enclosure is affixed to a front surface of gas distribution assembly so that the second reactive gas flowing from the second reactive gas ports flows through the enclosure and around the heating element. One or more embodiments further comprise moving the substrate relative to the gas distribution assembly so that each portion of the substrate is exposed to a flow of gases consisting essentially of, in order, the first reactive gas and the second reactive gas.

In some embodiments, the substrate is maintained at a temperature less than about 475° C. In one or more embodiments, the substrate is maintained at a temperature greater than about 350° C.

One or more embodiments of the invention are directed to processing method comprising soaking a substrate with silane and sequentially exposing the substrate previously soaked with silane to a first reactive and a second reactive gas, the first reactive gas comprising a tungsten-containing compound comprising a compound with the empirical formula $W_xCl_{5x}$ and hydrogen, the second reactive gas comprising a reductant to form a tungsten film. In some embodiments, the first reactive gas comprises more hydrogen than tungsten on an atomic basis. In one or more embodiments, the first reactive gas comprises the tungsten containing compound and the hydrogen are present in a ratio in the range of about 1:2 to 1:20.

Some embodiments of the invention are directed to processing methods comprising depositing a thickness of tungsten as a fill material on a work function material in a transistor, treating the deposited tungsten film and repeating to form a tungsten fill of a desired thickness, wherein treating the tungsten film comprises one or more of (1) sequentially exposing the fill material to titanium tetrachloride and ammonia; (2) soaking the fill material in titanium tetrachloride; and (3) exposing the fill material to a hydrogen plasma for a time in the range of about 10 seconds to about 30 seconds. In one or more embodiments, the thickness of tungsten deposited as a fill material in (a) is in the range of about 10 Å to about 30 Å. In some embodiments, the amount of TiN is less than about ½ a monolayer thick.

In some embodiments, when the tungsten film has a thickness of about 70 Å, the tungsten film has a grain size greater than about 60 Å. In one or more embodiments, when the tungsten film has a thickness of about 200 Å, the tungsten film has a resistivity less than about 30 $\mu\Omega\cdot cm$.

A method of forming a conformal tungsten film comprising sequentially exposing a surface to a first reactive gas comprising a tungsten-containing compound for a first time and a second reactive gas comprising hydrogen for a second time, the first time and the second time being less than about 2 second to deposit a tungsten film. In some embodiments, the tungsten film is grown at a rate less than about 1 Å/cycle. In one or more embodiments, the tungsten film is grown at a rate less than about 0.8 Å/cycle.

Some embodiments of the invention are directed to integrated circuit transistor devices comprising a dielectric layer disposed over a channel, a work function metal disposed over the dielectric layer, and a fill layer disposed over the work function layer, wherein the fill layer consisting essentially of W.

One or more embodiments are directed to integrated circuit transistor device a dielectric layer disposed over a channel, a work function layer on the dielectric layer consisting essentially of tungsten.

In some embodiments, the work function metal contains substantially no fluorine. In one or more embodiments, the fill layer contains substantially no fluorine.

In some embodiments, there is no intervening layer between the work function metal and the film consisting essentially of tungsten. In one or more embodiments, there is an intervening layer between the work function metal and the film consisting essentially of tungsten, the intervening layer have a thickness of less than about 5 Angstroms.

One or more embodiments are directed to processing methods comprising depositing a thickness of tungsten as a fill material on a work function material in a transistor; treating the deposited tungsten film; and repeating to form a tungsten fill of a desired thickness. Treating the tungsten film comprises one or more of (1) sequentially exposing the fill material to titanium tetrachloride and ammonia; (2) soaking the fill material in titanium tetrachloride; and (3) exposing the fill material to a hydrogen plasma for a time in the range of about 10 seconds to about 30 seconds. In some embodiments, the thickness of tungsten deposited as a fill material in (a) is in the range of about 10 Å to about 30 Å. In one or more embodiments, the amount of TiN is less than about ½ a monolayer thick.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIG. 9 shows a view of an assembly in accordance with one or more embodiments of the invention;

FIG. 10 shows a view of an assembly in accordance with one or more embodiments of the invention;

FIG. 13 shows a cross-sectional view of a gas distribution assembly in accordance with one or more embodiments of the invention.

DETAILED DESCRIPTION

Figure 1:
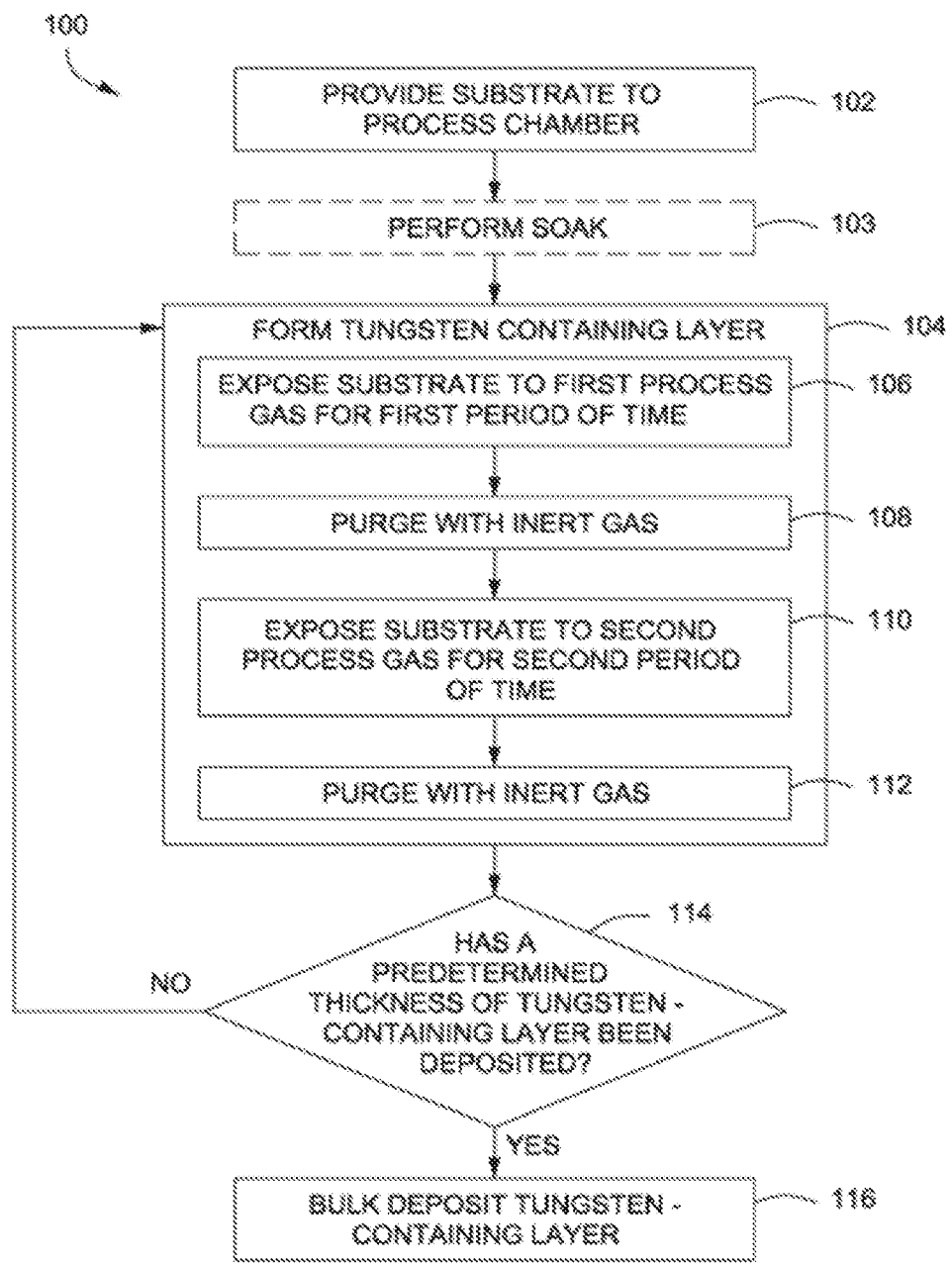
FIG. 1 illustrates an exemplary process sequence for the formation of a tungsten layer using a two pulse cyclical deposition technique according to one embodiment described herein.

Embodiments of the invention provide an improved process for depositing tungsten-containing films. The process of various embodiments uses vapor deposition techniques, such as an atomic layer deposition (ALD) to provide tungsten films having significantly improved surface uniformity and production level throughput. In some embodiments, the process allows the tungsten-containing film to be deposited onto an n-metal surface without a barrier layer. In some embodiments, the methods advantageously increase productivity and efficiency of processing semiconductor substrates by providing conformal deposition of tungsten-containing films at lower processing temperatures, preserving the thermal budget of the device being formed.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes. In some embodiments, the substrates comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

FIG. 1 depicts a method for forming a tungsten-containing layer on a substrate in accordance with some embodiments of the invention. The method 100 generally begins at 102, where a substrate, having a surface upon which a tungsten-containing layer is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the tungsten-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the tungsten-containing layer may be at least partially formed thereon. For example, in some embodiments, a layer comprising a metal, a nitride, an oxide, or the like, or combinations thereof may be disposed on the substrate and may have the tungsten containing layer formed upon such layer or layers.

In some embodiments, the substrate may be exposed to an optional soak process 103 prior to beginning the cyclical deposition process to form a tungsten-containing layer on the substrate (as discussed below at 104), as shown in phantom at 103. In one or more embodiments, the method of depositing the tungsten-containing layer on the substrate 104 does not require a soaking process. This means there is substantially no advantage to soaking prior to depositing the film. As used in this specification and the appended claims, the term "substantially no advantage" used in this respect means that there is less than about a 10% increase in the deposition rate or less than about a 20% difference in the conformality and uniformity of the deposited film. That being said, there are embodiments which are discussed further below in which a presoak forms an important part of the overall process. In some embodiments, the soak process may comprise heating the substrate to a soak temperature followed by exposing the substrate to a soak gas. For example, in some embodiments, the substrate may be heated to a temperature of about 100 to about 600° C., or in some embodiments, about 200° C. to about 600° C., or in some embodiments about 300° C. to about 500° C., or in some embodiments about 350° C. to about 420° C., or in some embodiments about 375° C. to about 500° C.

In some embodiments, the soak gas may comprise a reducing gas comprising a hydrogen gas and/or a hydride compound, such as silane compounds (e.g., silane, disilane, trisilane, tetrasilane, chlorosilane, dichlorosilane, tetrachlorosilane, hexachlorodisilane, methylsilane, or the like), borane compounds (e.g., borane, diborane, triborane, tetraborane, pentaborane, alkylboranes, or the like), phosphine, ammonia, amine compounds, hydrogen, derivatives thereof, combinations thereof, or the like. When present, the reducing gas adsorbs to and/or reacts with the substrate surface, to form a treated surface. In some embodiments, the treated surface provides a quicker deposition process for an overall smooth and more uniform subsequently deposited layers.

In some embodiments, the substrate is subjected to a silane soak. Some of these embodiments use a silane soak that is substantially only silane. As used in this specification and the appended claims, the term "substantially only silane" used in this respect means that the soaking fluid is 99% silane or greater as the soaking agent. For example, a soak solution that is 5% silane in hydrogen, would be considered 100% silane as the diluent (hydrogen) is not included.

In some embodiments, the reducing gas contains a hydrogen/hydride flow rate ratio of about 40:1 or greater, or in some embodiments, about 100:1 or greater, or in some embodiments, about 500:1 or greater, or in some embodiments, about 800:1 or greater, or in some embodiments, about 1,000:1 or greater. In some embodiments, the hydride compound (e.g., diborane) may have a flow rate of about 1 sccm to about 75 sccm, or in some embodiments, about 3 sccm to about 30 sccm, or in some embodiments, about 5 sccm to about 15 sccm. In some embodiments, the hydride compound may be within a carrier gas (e.g., hydrogen, nitrogen, argon, helium or the like), such that the mixture may have a flow rate within a range of about 50 sccm to about 500 sccm, or in some embodiments, about 75 sccm to about 400 sccm, or in some embodiments, about 100 sccm to about 300 sccm. In some embodiments, the hydrogen gas may be provided at a flow rate of about 1 slm to about 20 slm, or in some embodiments, from about 3 slm to about 15 slm, or in some embodiments, from about 5 slm to about 10 slm. The hydrogen/hydride flow rate ratio may be calculated by dividing the total hydrogen flow rate by the total hydride flow rate. The total hydrogen flow rate contains the sum of all sources of hydrogen including the flow rate of any hydrogen carrier gas and the flow rate of any independent hydrogen gas.

In some embodiments, the reducing gas may be mixed within the processing/deposition chamber or outside and may be coming from multiple sources. For example, in some embodiments, the substrate is exposed to the reducing gas which is formed by combining in the chamber a gas flow of a reducing or hydride compound and hydrogen mixture (e.g., 5% $B_2H_6$ in $H_2$) along with a gas flow of hydrogen gas. In another example, in some embodiments, the gas flow of the reducing or hydride compound and hydrogen mixture (e.g., 5% $B_2H_6$ in $H_2$) and the gas flow of hydrogen gas are combined prior to entering the chamber. Additional process parameters may be utilized to facilitate the soak process. For example, in some embodiments, the soak process may be performed while maintaining a pressure in the process chamber of about 1 Torr to about 150 Torr, or in some embodiments, from about 1 Torr to about 100 Torr, or in some embodiments, from about 10 Torr to about 50 Torr, or in some embodiments, from about 20 Torr to about 40 Torr, or in some embodiments, about 5 Torr to about 20 Torr. In some embodiments, the soak process may be performed for a time period within of about 1 second to about 90 seconds, or in some embodiments, less than about 60 seconds, or in some embodiments, less than about 30 seconds, or in some embodiments, less than about 10 seconds.

Next, at step 104, a tungsten-containing layer is formed on the substrate. The tungsten-containing layer may be formed via a cyclical deposition process, such as atomic layer deposition (ALD), or the like. In some embodiments, the forming of a tungsten-containing layer via a cyclical deposition process may generally comprise exposing the substrate to two or more process gases sequentially. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any of the embodiments described above for both time-domain ALD and spatial ALD processes, the sequences may be repeated until a desired layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the tungsten-containing layer at step 104 may begin by exposing the substrate to a first reactive gas. In some embodiments, the first reactive gas comprises a tungsten precursor (also referred to as a tungsten-containing gas, and the like) and is exposed to the substrate for a first period of time, as shown at 106. The tungsten precursor can be any suitable tungsten-containing gas including, but not limited to, halide based tungsten precursors or a metal-organic based tungsten precursor. For example, in some embodiments, the tungsten precursor may comprise tungsten pentachloride ($WCl_5$), compounds with the empirical formula of $WCl_5$ (e.g., $W_2Cl_{10}$, $W_3Cl_{15}$), tungsten hexachloride ($WCl_6$), compounds with the empirical formula of $WCl_6$ (e.g., $W_2Cl_{12}$), tungsten hexafluoride ($WF_6$). In one or more embodiments, the tungsten-containing precursor is selected from the group consisting of tungsten pentachloride, compounds with the empirical formula $WCl_5$ and tungsten hexachloride. In some embodiments, the tungsten-containing compound comprises a compound with the empirical formula $W_xCl_{5x}$, where x is greater than or equal to about 1 and y is greater than or equal to about 5. Without being bound by any particular theory of operation, it is believed that changing the anion from fluoride to chloride results in a larger ion which limits diffusion, resulting in a larger conduction. In some embodiments, the tungsten-containing film is substantially carbon free. As used in this specification and the appended claims, the term "substantially carbon free" means that there is less than about 1% or 0.5% or 0.1% carbon on an atomic basis in the film.

The tungsten-containing process gas may be provided in one or more pulses or continuously. The flow rate of the tungsten-containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The tungsten-containing precursor can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the tungsten-containing gas may be any suitable amount of time necessary to allow the tungsten precursor to form an adequate nucleation layer atop the substrate surfaces. For example, the process gas may be flowed into the process chamber for a period of about 0.1 seconds to about 90 seconds. In some time-domain ALD processes, the tungsten-containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the tungsten-containing gas. The inert gas may be mixed with the tungsten-containing gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the tungsten-containing gas is mixed with argon prior to flowing into the process chamber.

The temperature of the substrate during deposition can be controlled, for example, by setting the temperature of the substrate support or susceptor. In some embodiments the substrate is held at a temperature in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to the tungsten-containing process gas. For example, in some embodiments, the process chamber may be maintained at a pressure of about 0.3 to about 90 Torr.

In some embodiments, a low resistivity film (or a tunable grain size film) is deposited using a combination of silane presoaking and ALD W deposition. For example, a substrate is soaked in substantially only silane before any ALD cycles (i.e., in step 103 of FIG. 1). A tungsten-containing precursor is co-flowed with a relatively low amount of hydrogen gas during the tungsten exposure step 106. The amount of hydrogen co-flowed with the tungsten-containing precursor is low enough so that there is substantially no CVD deposition. Relatively low flow of hydrogen is relative to the amount of hydrogen needed for a reduction in step 110, not the amount of tungsten precursor being co-flowed. For example, hydrogen is co-flowed at about 5 sccm (where it is about 2000 times greater for reductions). In some embodiments, the first reactive gas which contains the tungsten-containing compound and hydrogen has more hydrogen than tungsten on an atomic basis. In one or more embodiments, the mixture of tungsten-containing precursor to hydrogen is in the range of about 1:2 to 1:20. The inventors have surprisingly found that a tungsten film deposited with processes using a silane soak and hydrogen co-flow has a higher grain size and a lower resistivity than other processes. A 70 Å tungsten film deposited by a standard process (i.e., no silane presoak and/or no hydrogen co-flow) has a grain size of 33 Å. The grain size for a 70 Å tungsten film using a silane soak and hydrogen co-flow is about 70 Å. In some embodiments, when the thickness of the tungsten film is about 70 Å, the tungsten film has a grain size greater than or equal to about 60 Å or 65 Å. A 200 Å tungsten film deposited by a standard process has a resistivity of about 40 μΩ·cm while a film deposited by the silane soak and hydrogen co-flow process has a resistivity of about 20 μΩ·cm. In some embodiments, when the tungsten film has a thickness of about 200 Å, the tungsten film has a resistivity less than or equal to about 20 μΩ·cm or 25 μΩ·cm.

Next, at step 108, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 106. In embodiments where the inert gas is the same, the purge may be performed by diverting the first process gas from the process chamber, allowing the inert gas to flow through the process chamber, thereby purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In some embodiment, however, the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess tungsten-containing gas from the process chamber, thereby preventing a reaction between the tungsten precursor and a subsequent reactive gas.

Next, at step 110, the substrate is exposed to a second process gas for a second period of time. The second process gas reacts with the tungsten-containing compound on the substrate surface to create a deposited film. The second process gas can have an important impact on the resulting tungsten film. For example, when the second process gas is $H_2$, a tungsten film is deposited, but when the second reactive gas is silane or disilane, a tungsten silicide film is deposited.

In some embodiments, the second reactive gas comprises hydrogen and the resulting film formed is a tungsten film. The hydrogen gas may be supplied to the substrate surface at a flow rate greater than the tungsten-containing gas concentration. In one or more embodiments, the flow rate of H$_2$ is greater than about 1 time that of the tungsten-containing gas, or about 100 times that of the tungsten-containing gas, or in the range of about 3000 to 5000 times that of the tungsten-containing gas. The hydrogen gas can be supplied, in time-domain ALD, for a time in the range of about 1 sec to about 30 sec, or in the range of about 5 sec to about 20 sec, or in the range of about 10 sec to about 15 sec. The hydrogen gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during the tungsten-containing film deposition.

In some embodiments, conformal coverage of a feature is performed using short step times in both the pulse and purge steps, typically about 1-2 seconds. This time is sufficient for a reasonable adsorption of the precursor onto the substrate surface in the pulse step and for purging away the excess precursors or reduction gases from the gas delivery path as well as chamber cavity in the purge step. As used in this specification and the appended claims, the term "reasonable adsorption" is enough adsorption for a film to grow. In some embodiments, a tungsten film is grown at a rate less than or equal to about 0.9 Å/cycle, 0.8 Å/cycle, 0.7 Å/cycle, or 0.6 Å/cycle. Lower growth rates are good for conformal growth whereas higher growth rates (e.g., above about 1 Å/cycle) tend to grow non-conformal films. One or more embodiments, of the invention are directed to conformal tungsten films.

In some embodiments, the second reactive gas comprises hydrogen radicals. The hydrogen radicals can be generated by any suitable means including exposure of hydrogen gas to a "hot-wire". As used in this specification and the appended claims, the term "hot-wire" means any element that can be heated to a temperature sufficient to generate radicals in a gas flowing about the element. This is also referred to as a heating element.

Accordingly, one or more embodiments of the invention are directed to methods of processing a substrate or depositing a film. At least a portion of the substrate is sequentially exposed to a first reactive gas comprising a metal complex and a second reactive gas. The metal complex can be any suitable metal complex for ALD processing including, but not limited to, organometallic complexes. In some embodiments, the organometallic complex comprises a tungsten-containing compound. The tungsten-containing compound of some embodiments has the empirical formula WCl$_5$ (e.g., WCl$_5$, W$_2$Cl$_{10}$). In one or more embodiments, the tungsten-containing compound has the empirical formula WCl$_6$ (e.g., WCl$_6$, W$_2$Cl$_{12}$). The second reactive gas may comprise hydrogen radicals. The method of some embodiments is practices in a spatial atomic layer deposition chamber or by a spatial atomic layer deposition process. Spatial ALD may be particularly effective in the deposition of a tungsten film with hydrogen radicals because the device used to generate radicals (e.g., a hot wire) can be isolated from the metal organic precursors which are often incompatible with the hot wire material.

The second reactive gas (e.g., hydrogen), while passing the hot wire, or heating element, becomes radicalized. For example, H$_2$ passing a hot tungsten wire can result in the generation of H*. These hydrogen radicals are more reactive than ground state hydrogen atoms.

To be effective, the heating element must be heated to a temperature sufficient to create radicals. Heating can occur by, for example, passing sufficient electrical current through the heating element to elevate the temperature of the heating element.

Next, at 112, process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, thereby purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of about 0 to about 10,000 sccm to purge the process chamber.

While the generic embodiment of the processing method shown in FIG. 1 includes only two pulses of reactive gases, it will be understood that this is merely exemplary and that additional pulses of reactive gases may be required. For example, a nitride film of some embodiments can be grown by a first pulse containing a precursor gas like tungsten pentachloride, a second pulse with a reducing agent followed by purging and a third pulse for nitridation. The pulses can be repeated in their entirety or in part. For example all three pulses could be repeated or only two can be repeated. This can be varied for each cycle as desired.

Next, at 114, it is determined whether the tungsten-containing layer has achieved a predetermined thickness. If the predetermined thickness has not been achieved, the method 100 returns to 104 to continue forming the tungsten-containing layer until the predetermined, or desired, thickness is reached. Once the predetermined thickness has been reached, the method 100 can either end or proceed to 116 where a bulk deposition process may be performed to deposit the remaining thickness of the tungsten-containing layer. In some embodiments, the bulk deposition process may be a CVD process. Upon completion of deposition of the tungsten-containing layer to a desired thickness, the method 100 generally ends and the substrate can proceed for any further processing. For example, in some embodiments, a CVD process may be performed to bulk deposit the tungsten-containing layer to a target thickness. For example in some embodiments, the tungsten-containing layer may be deposited via ALD or CVD reaction of the tungsten precursor and hydrogen radicals to form a total layer thickness of about 10 to about 10,000 Å, or in some embodiments, about 10 to about 1000 Å, or in some embodiments, about 500 to about 5,000 Å.

While the descriptions have generally referred to the tungsten-containing gas as the first gas, it will be understood by those skilled in the art that this is merely illustrative. In some embodiments, the substrate is first exposed to the second reactive gas followed by the tungsten-containing gas.

In any of the above embodiments, each cycle consisting of exposing the substrate to a first process gas, purging with an inert gas, exposing the substrate to a second process gas, and purging with an inert gas may form a tungsten-containing layer having a thickness of about 0.1 to about 1.5 Å on the substrate. In some embodiments, the thickness grows at a rate in the range of about 0.1 Å/cycle to about 5 Å/cycle, or in the range of about 0.2 Å/cycle to about 3 Å/cycle, or in the range of about 0.3 Å/cycle to about 2 Å/cycle. The sequence may be repeated until a desired total thickness of the tungsten-containing layer is achieved. For example, in some embodiments, the tungsten-containing layer may comprise a total thickness of about 2 Å to about 200 Å, or in some embodiments, about 50 Å. Accordingly, the deposition process may require up to about 2000 cycles to reach the desired thickness.

In any of the above embodiments, the flow rates and/or durations of each pulse may be the same or may vary over the course of the total cycles required to form a particular tungsten-containing layer, thereby facilitating layers having either uniform or graded compositions.

In some embodiments, the substrate surface is preconditioned. For example, if the surface of the substrate is an oxide, it may be desirable to perform a pre-soak using a hydride or hydride/hydrogen mixture. The hydride adsorbs and/or reacts with the substrate surface to form a conditioned surface, allowing for a uniform tungsten-containing layer to be formed. In some embodiments, the hydride may comprise silane ($Si_xH_y$) compounds (e.g., silane ($SiH_4$), disilane ($Si_2H_6$), trisilane ($Si_3H_8$), chlorosilane, dichlorosilane ($H_2SiCl_2$), or the like), borane ($B_xH_y$) compounds (e.g., diborane ($B_2H_6$), triborane ($B_3H_8$), pentaborane ($B_5H_9$), or the like), phosphine ($PH_3$), derivatives thereof, combinations thereof, or the like. In addition, in some embodiments, the hydride may be diluted in a dilutant gas, for example an inert gas, such as argon (Ar), helium (He), nitrogen ($N_2$), hydrogen ($H_2$), or the like. For example, in such embodiments, the hydride may be provided in a mixture of about 5% hydride to about 95% diluent gas by volume. In some embodiments, for example where the hydride comprises diborane, the flow rate of the hydride may be about 1 to about 75 sccm.

In an embodiment, a tungsten film may be formed by placing a substrate with 10 Å or more of a metallic layer, such as ALD TiN, TiSiN, TiAl, PVD Ti, TiN, or, if an oxide, soak with either disilane or a mixture of hydrogen and silane at 5 to 20 Torr partial pressure on a pedestal held at a temperature in the range of about 400 to about 475° C. A tungsten-containing compound (e.g., $WCl_5$ or $WCl_6$) can be pulsed with a mixture of argon to the wafer surface at 5 to 20 Torr followed by purging with argon (or another inert gas). Argon pressure is increased to about 20 Torr and then hydrogen pulsing is started. The hydrogen radical pulsing may be done at high flow so that the ratio of hydrogen to tungsten-containing compound is in the range of about 3000 to 5000, for about 10 to 15 seconds. The chamber is purged with argon (or another inert gas) for 5 to 10 seconds. The cycle is repeated until the growth of the tungsten film reaches a designated thickness.

Some embodiments of the invention are directed to tungsten containing films. These film include, tungsten metal films, tungsten nitrides, silicide and tungsten silicon nitride. The tungsten containing films can be used for any number of suitable purposes including, but not limited to, p-metal work function layers and fill materials.

Accordingly, some embodiments of the invention are directed to fluorine-free tungsten films used as the p-metal work function layer to manufacture metal gates in field effect transistor (FET) devices, in both logic and memory applications. The film grown by the described processes has significant benefits including a significantly lower resistivity and higher thermal stability (can be annealed up to 1000° C.) than other films currently used as a gate metal. The thermal stability is especially important for VNAND and BWL in memory applications. One or more embodiments of the invention are directed to tungsten films having a work function greater than about 4.6 eV or about 4.7 eV, or about 4.8 eV. The work function metal can be deposited on a gate oxide of the FET. The work function metal controls the threshold value for current flow. A low threshold value requires less energy usage so a more conductive metal is better. Tungsten films deposited by known processes results in a film typically with a work function of about 4.45 eV.

Some embodiments of the invention are directed to integrated circuit transistor devices comprising a dielectric layer disposed over a channel. A work function metal is disposed over the dielectric layer and a fill layer consisting essentially of tungsten is deposited over the work function layer. As used in this specification and the appended claims, the term "consisting essentially of tungsten" used in this regard means that the fill layer is greater than about 95%, 98% or 99% tungsten. The work function layer of some embodiments comprises one or more of Ti and TiAl. In one or more embodiments, the work function metal contains substantially no fluorine. In some embodiments, the fill layer contains substantially no fluorine. As used in this specification and the appended claims, the term "substantially no fluorine" means that there is less than about 5%, 4%, 3%, 2%, 1%, 0.5% or 0.1% fluorine in the film on an atomic basis. In some embodiments, there is no intervening layer between the work function metal and the film consisting essentially of tungsten.

In one or more embodiments, there is an intervening layer between the work function metal and the film consisting essentially of tungsten. The intervening layer can have any suitable thickness depending on the intended use of the integrated circuit transistor. In some embodiments, the intervening layer has a thickness less than about 7 Å, 6 Å, 5 Å, 4 Å or 3 Å.

In some embodiments, the tungsten containing film is used as a low resistivity fill material. To achieve a complete seamless fill, a periodic treatment (e.g., after every 10 to 30 Å film) is applied. The method of the treatment includes (a) alternating exposure to $TiCl_4$ and ammonia; (b) performing a $TiCl_4$ soak or (c) hydrogen direct or remote plasma exposure for 10 to 30 seconds. The treatment can be performed at the same temperature as the deposition process. The processes described will deposit about 0.7 Å TiN (less than 1 Å TiN) to refresh the surface and remove extra chloride during deposition. The amount of TiN deposited in these embodiments is less than about ½ a monolayer or in the range of about ⅓ to about ⅕ of a monolayer of TiN.

It has been found that the various tungsten films described can be useful for, for example, (1) nucleation and film growth repeatability using a silane soak; (2) adhesions on oxides by growing an initial one or two layers of tungsten silicide; (3) reducing roughness by soaking in ammonia, followed by soaking in silane (to increase nucleation density) (4) by $TiCl_4/NH_3$ cycles (on oxide or oxidized surface) to deposit less than about 1 Å TiN at the interface; and (5) integration of thin TiN, to provide good nucleation, adhesion and conformality (deposited by any suitable method and reagents).

Figure 2:
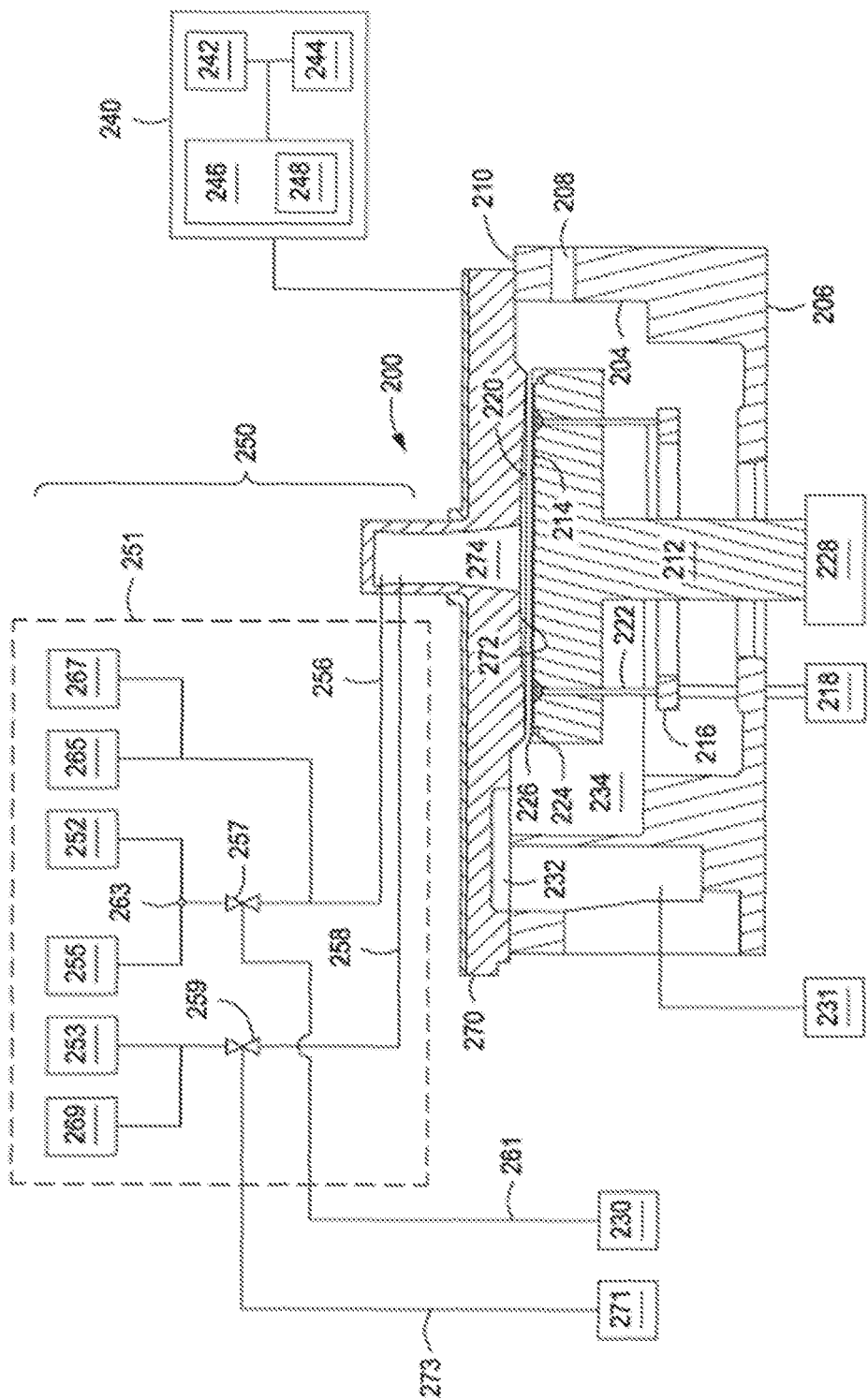
FIG. 2 shows an exemplary ALD processing system.

FIG. 2 shows a schematic cross-sectional view of an embodiment of an apparatus that may be used to perform time-domain ALD embodiments of the present invention. The apparatus may be any suitable apparatus for processing substrates, for example, the GEMINI ALD chamber or the Centura ALD chamber, both available from Applied Materials, Inc., of Santa Clara, Calif.

The apparatus of FIG. 2 is generally a process chamber 200 having a chamber body 206 and a chamber lid 270 disposed on an upper surface 210 of the chamber body 206 to define an interior volume 234. A substrate support 212 disposed in the interior volume 234 supports the substrate 220 on a substrate receiving surface 214. The substrate support (or pedestal) 212 is mounted to a lift motor 228 to raise or lower the substrate support 212 and a substrate 220 disposed thereon. A lift plate 216 coupled to a lift motor 218 is mounted in the process chamber 200 and raises or lowers pins 222 movably disposed through the substrate support 212. The pins 222 raise or lower the substrate 220 over the surface of the substrate support 212. In some embodiments, the substrate support 212 includes a vacuum chuck, an electrostatic chuck, or a clamp ring for securing the substrate 220 to the substrate support 212. An opening 208 formed in a wall 204 of the chamber body 206 facilitates entry and egress of a substrate into and out of the process chamber 200.

The substrate support 212 is heated to increase the temperature of the substrate 220 disposed thereon. For example, the substrate support 212 may be heated using an embedded heating element, such as a resistive heater or may be heated using radiant heat, such as heating lamps disposed above the substrate support 212. A purge ring 224 is disposed on the substrate support 212 to define a purge channel 226 which provides a purge gas to a peripheral portion of the substrate 220 to prevent deposition thereon.

An exhaust system 231 is in communication with a pumping channel 232 to evacuate any undesirable gases from the process chamber 200. The exhaust system 231 also helps in maintaining a desired pressure or a desired pressure range inside the process chamber 200.

The gas delivery system 250 is coupled to the chamber body 206 to provide precursors, process gases, carrier gases and/or purge gases to the process chamber 200. The gas delivery system 250 may generally comprise a gas panel 251 having a plurality of gas sources (six shown) 252, 253, 255, 265, 267, 269 and a plurality of valves (two shown) 257, 259 coupled to one or more conduits (e.g., conduits 256, 258) to control a flow of gas from the gas panel 251 to the process chamber 200. In some embodiments, the plurality of gas sources 252, 253, 255, 265, 267, 269 may be configured such that each of the plurality of gas sources 252, 253, 255, 265, 267, 269 may provide a separate gas (e.g., a precursor, process gas, carrier gas, purge gas, etc.), for example, such as the gases described above with respect to FIG. 1.

In some embodiments, for example such as depicted in FIG. 2, the gas panel 251 may be configured to combine some of the gases provided by the plurality of gas sources 252, 253, 255, 265, 267, 269 prior to reaching the process chamber 200. In some embodiments, one or more valves 257, 259 may be disposed along the conduits 256, 261 to control the flow of gas provided by the plurality of gas sources 252, 253, 255, 265, 267, 269. The valves 257, 259 may be any type of valve, for example, a switching valve, high speed valve, stop valve, or the like, to facilitate pulsing the gas provided by the gas panel 251. In some embodiments, for example, as depicted in FIG. 2, the valves 257, 259 may be a two way valve, for example a diverter valve configured to divert the flow of gas away from the process chamber 200 via conduits 261, 273 coupled to an exhaust system 230, 271. The exhaust systems, 230, 231, and 271 may each be the same exhaust system or may be partially or completely separate systems to prevent reaction and/or deposition of materials within the exhaust system that may shorten the life or require maintenance and/or cleaning of the components of the exhaust system (e.g., pumps, conduits, valves, and the like). In such embodiments, the valves 257, 259 may be located in any position along the respective conduits 256, 258 suitable to selectively control one or more gases simultaneously. For example, the valve 257 (a first valve) may be disposed downstream of a junction 263 coupling the first gas source 252 and second gas source 255 to selectively provide the gases to the process chamber 200 via the conduit 256 or divert the gases to the exhaust system 230 via the conduit 261, as depicted in FIG. 2. In addition, in some embodiments, the valve 259 (a second valve) may be disposed downstream of the fifth gas source 253 to selectively provide the gases to the process chamber 200 via the conduit 258 or divert the gases to the exhaust system 271 via the conduit 273. In some embodiments, the sixth gas source 269 may be coupled to the fifth gas source 253 upstream of the valve 259 (as shown) or downstream of the valve 259 to allow gases provided by the sixth gas source 269 to be provided with the gases from the fifth gas source 253.

In some embodiments, one or more flow restrictors (not shown) may be disposed along the conduit 256 before and/or after the valves 257, 259. The inclusion of the one or more flow restrictors may reduce variations in pressure within the conduit 256 when the flow of gas is diverted to or from the process chamber, thereby delivering consistent quantities of the gases provided by the gas sources 252, 253, 255.

In some embodiments, for example, such as where a solid or liquid precursor is utilized, the gas delivery system 250 may also comprise one or more ampoules. In such embodiments, the one or more ampoules may be configured to allow the solid or liquid precursor to be contained and sublime into gaseous form for delivery into the process chamber 200.

Returning to FIG. 2, at least a portion of a bottom surface 272 of the chamber lid 270 may be tapered from an expanding channel 274 to a peripheral portion of the chamber lid 270. The expanding channel 274 improves velocity profile of gas flow from the expanding channel 274 across the surface of the substrate 220 (i.e., from the center of the substrate to the edge of the substrate). In some embodiments, the bottom surface 272 comprises one or more tapered surfaces, such as a straight surface, a concave surface, a convex surface, or combinations thereof. In some embodiments, the bottom surface 272 is tapered in the shape of a funnel. The expanding channel 274 is one exemplary embodiment of a gas inlet for delivering the sublimed precursor and carrier gas from the conduit 256 to the substrate 220. Other gas inlets are possible, for example, a funnel, a non-tapering channel, nozzles, showerheads, or the like.

A controller 240, such as a programmed personal computer, work station computer, or the like is coupled to the process chamber 200. Illustratively, the controller 240 comprises a central processing unit (CPU) 242, support circuitry 244, and a memory 246 containing associated control software 248. The controller 240 controls the operating conditions of processes performed in the process chamber, such as, for example, an ALD process as described above with respect to FIG. 1. For example, the controller 240 may be configured to control the flow of various precursor gases and purge gases from the gas delivery system 250 to the process chamber 200 during different stages of the deposition cycle.

Figure 3:
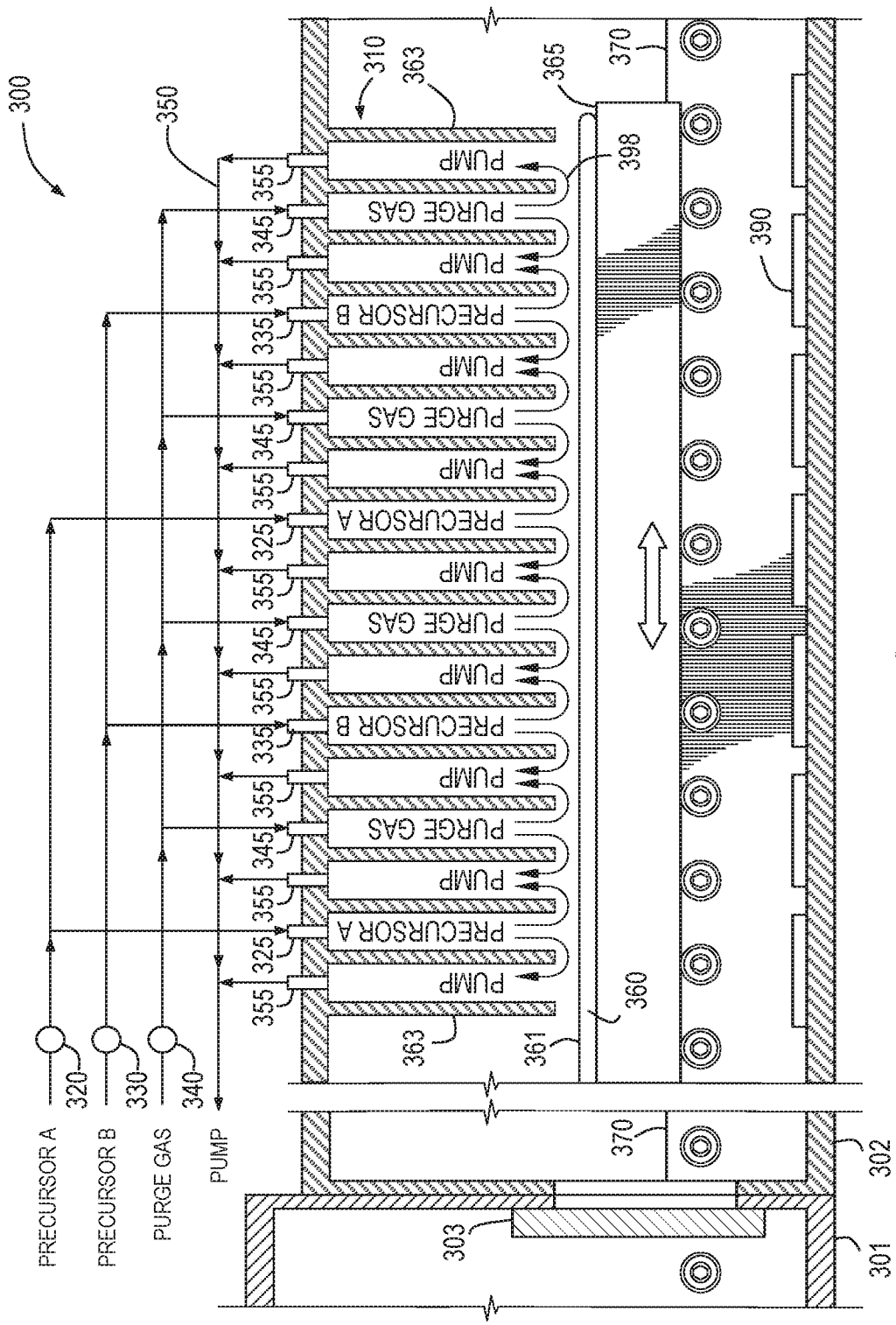
FIG. 3 shows an exemplary spatial ALD processing system.

FIG. 3 is a schematic cross-sectional view of a spatial atomic layer deposition system 300 or reactor in accordance with one or more embodiments of the invention. The system 300 includes a load lock chamber 301 and a processing chamber 302. The processing chamber 302 is generally a sealable enclosure, which is operated under vacuum, or at least low pressure. The processing chamber 302 is isolated from the load lock chamber 301 by an isolation valve 303. The isolation valve 303 seals the processing chamber 302 from the load lock chamber 301 in a closed position and allows a substrate 360 to be transferred from the load lock chamber 301 through the valve to the processing chamber 302 and vice versa in an open position.

The system 300 includes a gas distribution assembly 310 capable of distributing one or more gases across a substrate 360. The gas distribution assembly 310 can be any suitable distribution plate known to those skilled in the art, and specific gas distribution assemblies described should not be taken as limiting the scope of the invention. The output face of the gas distribution assembly 310 faces the first surface 361 of the substrate 360.

The gas distribution assembly 310 comprises a plurality of gas ports configured to transmit one or more gas streams to the substrate 360 and a plurality of vacuum ports disposed between each gas port and configured to transmit the gas streams out of the processing chamber 302. In the detailed embodiment of FIG. 3, the gas distribution assembly 310 comprises a first precursor injector 320, a second precursor injector 330 and a purge gas injector 340.

The injectors 320, 330, 340 may be controlled by a system computer (not shown), such as a mainframe, or by a chamber-specific controller, such as a programmable logic controller. The precursor injector 320 is configured to inject a continuous (or pulse) stream of a reactive precursor of compound A into the processing chamber 302 through a plurality of gas ports 325. The precursor injector 330 is configured to inject a continuous (or pulse) stream of a reactive precursor of compound B into the processing chamber 302 through a plurality of gas ports 335. The purge gas injector 340 is configured to inject a continuous (or pulse) stream of a non-reactive or purge gas into the processing chamber 302 through a plurality of gas ports 345. The purge gas helps remove reactive material and reactive by-products from the processing chamber 302. The purge gas is typically an inert gas, such as, nitrogen, argon and helium. Gas ports 345 are disposed in between gas ports 325 and gas ports 335 so as to separate the precursor of compound A from the precursor of compound B, thereby avoiding cross-contamination between the precursors. The gas ports 325, 335, 345 and vacuum ports 355 of some embodiments are elongate gas ports which form a channel of gas directed toward (or away from) the substrate surface so that the channel extends across a portion of the substrate.

In another aspect, a remote plasma source (not shown) may be connected to the precursor injector 320 and the precursor injector 330 prior to injecting the precursors into the chamber 302. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high intensity light source (e.g., UV energy), or exposure to an x-ray source. Exemplary remote plasma sources are available from vendors such as MKS Instruments, Inc. and Advanced Energy Industries, Inc.

The system 300 further includes a pumping system 350 connected to the processing chamber 302. The pumping system 350 is generally configured to evacuate the gas streams out of the processing chamber 302 through one or more vacuum ports 355. The term "vacuum port" is used interchangeably with "pump port". The vacuum ports 355 are disposed between each gas port so as to evacuate the gas streams out of the processing chamber 302 after the gas streams react with the substrate surface and to further limit cross-contamination between the precursors.

The system 300 includes a plurality of partitions 363 disposed in the processing chamber 302 between each port. A lower portion of each partition 363 extends close to the first surface 361 of substrate 360. For example, about 0.5 mm or greater from the first surface 361. In this manner, the lower portions of the partitions 363 are separated from the substrate surface 361 by a distance sufficient to allow the gas streams to flow around the lower portions toward the vacuum ports 355 after the gas streams react with the substrate surface 361. Arrows 398 indicate the direction of the gas streams. Since the partitions 363 operate as a physical barrier to the gas streams, they also limit cross-contamination between the precursors. The arrangement shown is merely illustrative and should not be taken as limiting the scope of the invention. It will be understood by those skilled in the art that the gas distribution system shown is merely one possible distribution system and the other types of showerheads may be employed.

In operation, a substrate 360 is delivered (e.g., by a robot) to the load lock chamber 301 and is placed on a shuttle 365. After the isolation valve 303 is opened, the shuttle 365 is moved along the track 370. Once the shuttle 365 enters in the processing chamber 302, the isolation valve 303 closes, sealing the processing chamber 302. The shuttle 365 is then moved through the processing chamber 302 for processing. In one embodiment, the shuttle 365 is moved in a linear path through the chamber.

As the substrate 360 moves through the processing chamber 302, the first surface 361 of substrate 360 is repeatedly exposed to the precursor of compound A coming from gas ports 325 and the precursor of compound B coming from gas ports 335, with the purge gas coming from gas ports 345 in between. Injection of the purge gas is designed to remove unreacted material from the previous precursor prior to exposing the substrate surface 361 to the next precursor. After each exposure to the various gas streams (e.g., the precursors or the purge gas), the gas streams are evacuated through the vacuum ports 355 by the pumping system 350. Since a vacuum port may be disposed on both sides of each gas port, the gas streams are evacuated through the vacuum ports 355 on both sides. Thus, the gas streams flow from the respective gas ports vertically downward toward the first surface 361 of the substrate 360, across the substrate surface 361 and around the lower portions of the partitions 360, and finally upward toward the vacuum ports 355. In this manner, each gas may be uniformly distributed across the substrate surface 361. Arrows 398 indicate the direction of the gas flow. Substrate 360 may also be rotated while being exposed to the various gas streams. Rotation of the substrate may be useful in preventing the formation of strips in the formed layers. Rotation of the substrate can be continuous or in discreet steps.

Sufficient space is generally provided at the end of the processing chamber 302 so as to ensure complete exposure by the last gas port in the processing chamber 302. Once the substrate 360 reaches the end of the processing chamber 302 (i.e., the first surface 361 has completely been exposed to every gas port in the chamber 302), the substrate 360 returns back in a direction toward the load lock chamber 301. As the substrate 360 moves back toward the load lock chamber 301, the substrate surface may be exposed again to the precursor of compound A, the purge gas, and the precursor of compound B, in reverse order from the first exposure.

The extent to which the substrate surface 361 is exposed to each gas may be determined by, for example, the flow rates of each gas coming out of the gas port and the rate of movement of the substrate 360. In one embodiment, the flow rates of each gas are configured so as not to remove adsorbed precursors from the substrate surface 361. The width between each partition, the number of gas ports disposed on the processing chamber 302, and the number of times the substrate is passed back and forth may also determine the extent to which the substrate surface 361 is exposed to the various gases. Consequently, the quantity and quality of a deposited film may be optimized by varying the above-referenced factors.

In another embodiment, the system 300 may include a precursor injector 320 and a precursor injector 330, without a purge gas injector 340. Consequently, as the substrate 360 moves through the processing chamber 302, the substrate surface 361 will be alternately exposed to the precursor of compound A and the precursor of compound B, without being exposed to purge gas in between.

The embodiment shown in FIG. 3 has the gas distribution assembly 310 above the substrate. While the embodiments have been described and shown with respect to this upright orientation, it will be understood that the inverted orientation is also possible. In that situation, the first surface 361 of the substrate 360 will face downward, while the gas flows toward the substrate will be directed upward.

In yet another embodiment, the system 300 may be configured to process a plurality of substrates. In such an embodiment, the system 300 may include a second load lock chamber (disposed at an opposite end of the load lock chamber 301) and a plurality of substrates 360 or a carousel processing chamber with one or more gas distribution assemblies. The substrates 360 may be delivered to the load lock chamber 301 and retrieved from the second load lock chamber. In one or more embodiments, at least one radiant heat lamp 390 is positioned to heat the second side of the substrate 360.

In some embodiments, the shuttle 365 is a susceptor 366 for carrying the substrate 60. Generally, the susceptor 366 is a carrier which helps to form a uniform temperature across the substrate. The susceptor 366 is movable in both directions (left-to-right and right-to-left, relative to the arrangement of FIG. 3) between the load lock chamber 301 and the processing chamber 302. The susceptor 366 has a top surface 367 for carrying the substrate 360. The susceptor 366 may be a heated susceptor so that the substrate 360 may be heated for processing. As an example, the susceptor 366 may be heated by radiant heat lamps 390, a heating plate, resistive coils, or other heating devices, disposed underneath the susceptor 366.

Figure 4:
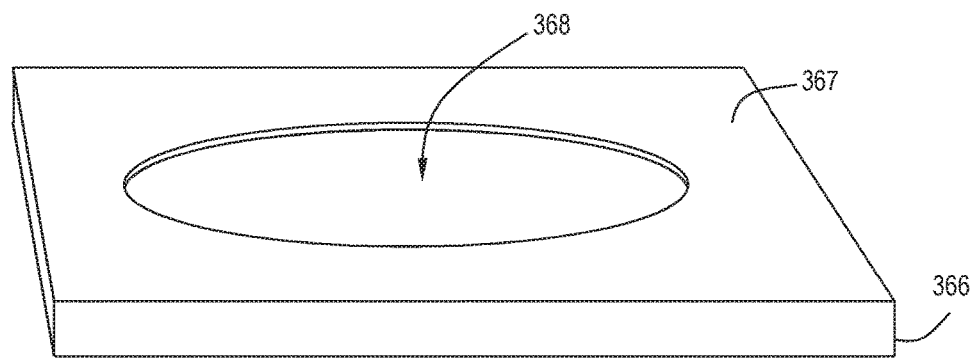
FIG. 4 shows a susceptor for use with the spatial ALD processing system.
Figure 5:
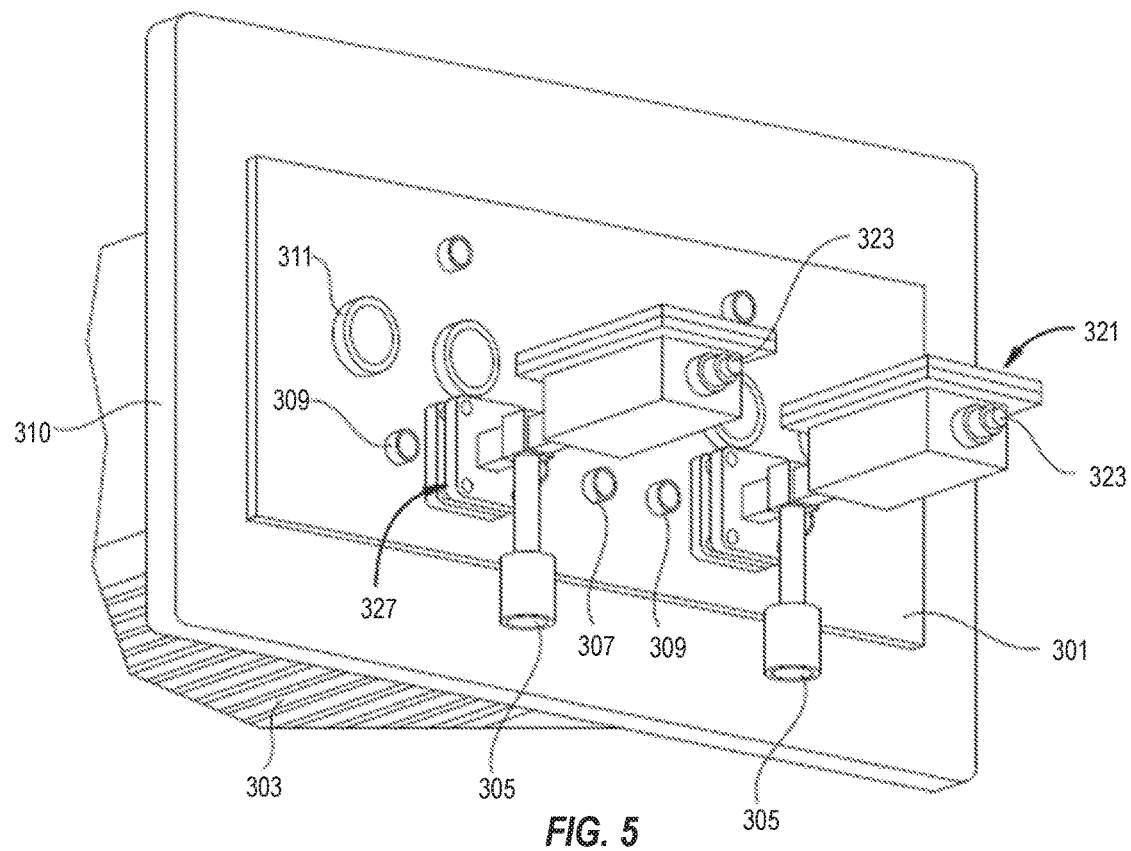
FIG. 5 shows a perspective view of a gas distribution assembly in accordance with one or more embodiments of the invention.

In still another embodiment, the top surface 367 of the susceptor 366 includes a recess 368 configured to accept the substrate 360, as shown in FIG. 4. The susceptor 366 is generally thicker than the thickness of the substrate so that there is susceptor material beneath the substrate. In detailed embodiments, the recess 368 is configured such that when the substrate 360 is disposed inside the recess 368, the first surface 361 of substrate 360 is level with the top surface 367 of the susceptor 366. Stated differently, the recess 368 of some embodiments is configured such that when a substrate 360 is disposed therein, the first surface 361 of the substrate 360 does not protrude above the top surface 367 of the susceptor 366.

FIGS. 5-14 show gas distribution assemblies 310 in accordance with various embodiments of the invention. The gas distribution assemblies 310 comprise an input face 301 and an output face 303. The input face 301 (shown in FIG. 5) has a first reactive gas input 305 for receiving a flow of a first reactive gas A and a second reactive gas input 307 for receiving a flow of a second reactive gas B. The input face 301 also has inputs 309 for one or more purge gases and ports 311 for connecting to one or more vacuum ports.

The output face 303 of various embodiments has a plurality of elongate gas ports 313. The gas ports 313 are configured to direct flows of gases toward a substrate which may be positioned adjacent the output face 303. The elongate gas ports 313 include at least one first reactive gas port and at least one second reactive gas port. Each first reactive gas port is in flow communication with the first reactive gas input 305 to allow the first precursor to flow through the gas distribution assembly 310. Each second reactive gas port is in flow communication with the second reactive gas input 307 to allow the second precursor to flow through the gas distribution assembly 310.

Figure 6:
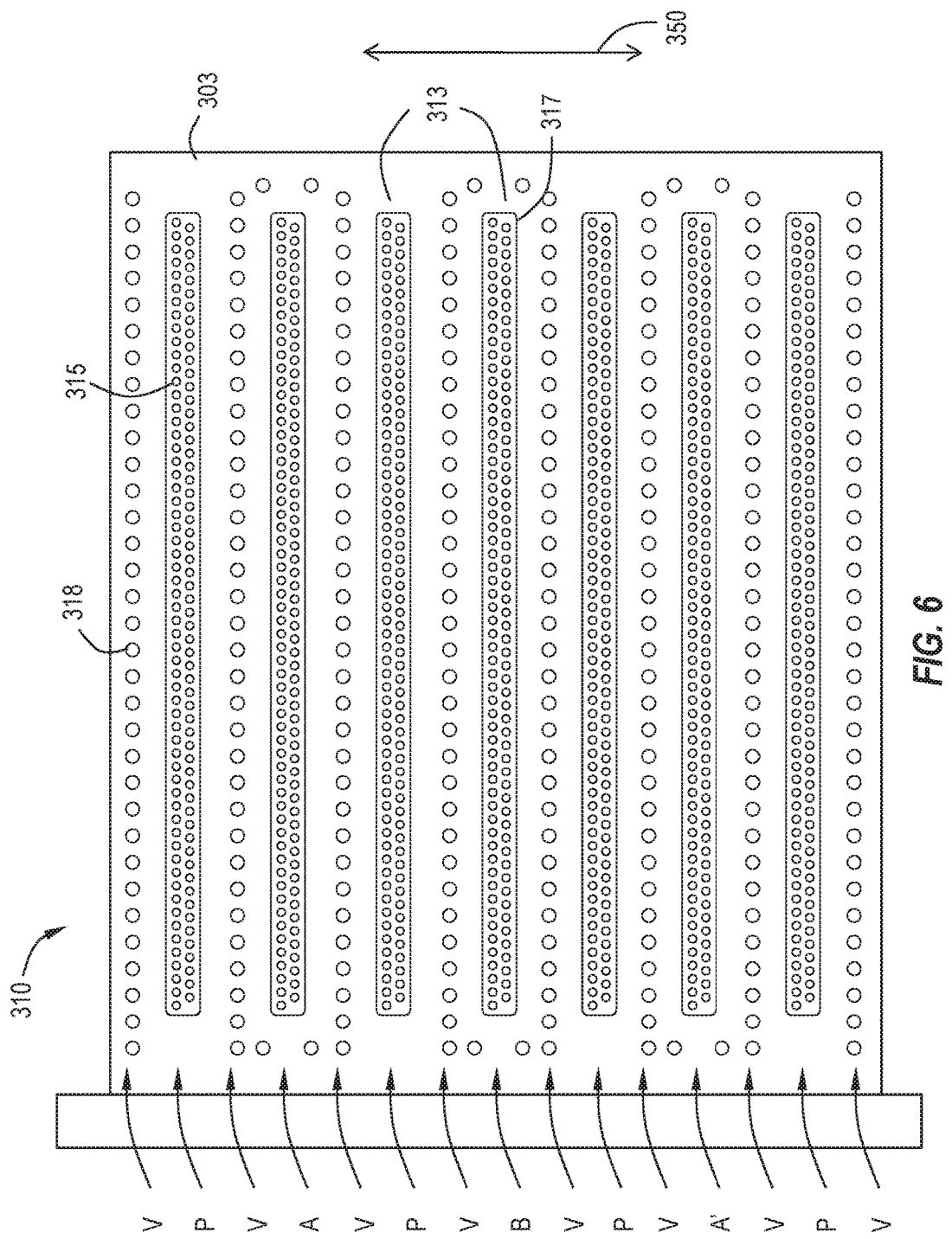
FIG. 6 shows a front view of a gas distribution assembly in accordance with one or more embodiments of the invention.

As shown in FIG. 6, the gas ports may include a plurality of openings 315 within a channel 317. The channel 317 is a recessed slot within the output face of the gas distribution assembly. The gases flow out of the openings 315 and are directed by the channel 317 walls toward the substrate surface. The openings 315 are shown as being circular, but it should be understood that the openings 315 can be any suitable shape including, but not limited to, square, rectangular and triangular. The number and size of the openings 315 can also be changed to fit more or less openings within each channel 317. In the detailed embodiment shown in FIG. 6, the purge gases (P), first reactive gas ports (A) and second reactive gas ports (B) comprise a plurality of openings positioned within channels. The openings 318 associated with the vacuum ports are on the output face 303 of the gas distribution assembly 310, rather than in a channel 317, but could also be positioned within a channel.

The specific embodiment shown in FIG. 6 has a combination of elongate gas ports that will provide a specific sequence of gas streams to a substrate surface when the substrate is moved perpendicularly to the elongate gas ports along arrow 350. Although the substrate is described as being moved, it will be understood by those skilled in the art that the substrate can remain stationary and the gas distribution assembly 310 can move. It is the relative movement between the substrate and gas distribution assembly 310 that is referred to as substrate movement. The substrate, moving perpendicularly to the elongate gas ports will be subjected to gas flows of, in order, a purge gas stream, a first reactive gas A stream, a purge gas stream, a second reactive gas B stream, a purge gas stream, a first reactive gas A' stream and a purge gas stream. Between each of the gas streams are vacuum ports which direct the gas streams out of the processing chamber. This results in a flow pattern in accordance with arrow 398 shown in FIG. 3.

In specific embodiments, the gas distribution assembly consists essentially of, in order, a leading first reactive gas port A, a second reactive gas port B and a trailing first reactive gas port A'. As used in this context, and in the appended claims, the term "consisting essentially of" means that the gas distribution assembly does not include any additional gas ports for reactive gases. Ports for non-reactive gases (e.g., purge gases) and vacuum can be interspersed throughout while still being within the consisting essentially of clause. For example, the gas distribution assembly 310 may have eight vacuum ports V and four purge ports P but still consist essentially of a leading first reactive gas port A, a second reactive gas port B and a trailing reactive gas port A'. Embodiments of this variety may be referred to as an ABA configuration.

The use of the ABA configuration ensures that a substrate moving from either direction will encounter a first reactive gas A port before encountering a second reactive gas B port. Each pass across the gas distribution assembly 310 will result in a single film of composition B. Here, the two first reactive gas A ports surround the second reactive gas B port so that a substrate moving (relative to the gas distribution assembly) from top-to-bottom of the figure will see, in order, the leading first reactive gas A, the second reactive gas B and the trailing first reactive gas A', resulting in a full layer being formed on the substrate. A substrate returning along the same path will see the opposite order of reactive gases, resulting in two layers for each full cycle. A substrate moved back and forth across this gas distribution assembly will be exposed to a pulse sequence of AB AAB AAB (AAB)$_n$ . . . AABA forming a uniform film composition of B. Exposure to the first reactive gas A at the end of the sequence is not important as there is no follow-up by a second reactive gas B. It will be understood by those skilled in the art that while the film composition is referred to as B, it is really a product of the surface reaction products of reactive gas A and reactive gas B and that use of just B is for convenience in describing the films.

Figure 7:
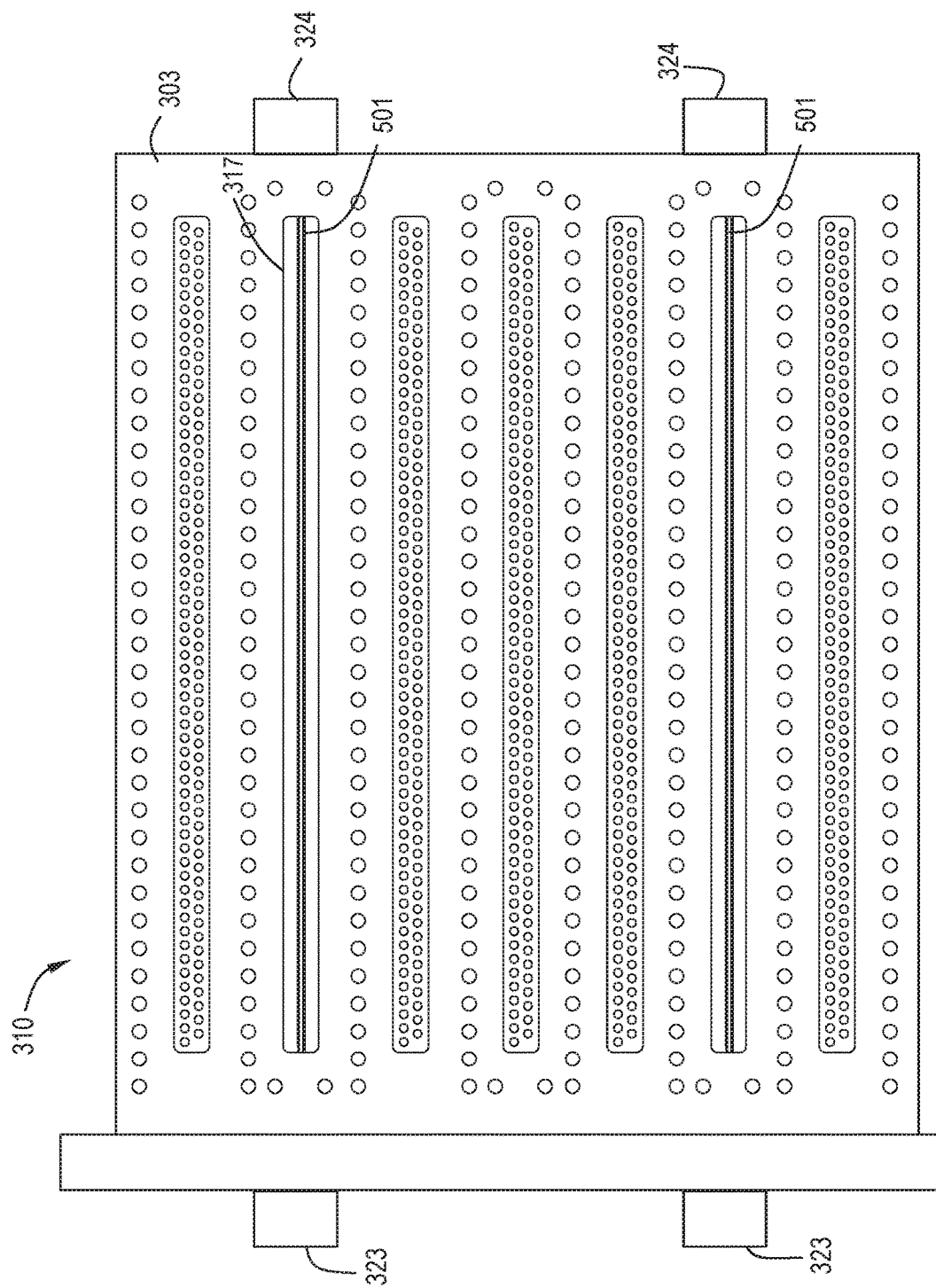
FIG. 7 shows a front view of a gas distribution assembly in accordance with one or more embodiments of the invention.

The gas distribution assembly 310, as shown in FIG. 7, includes a heating element 501, which may also be referred to as a "wire" or "hot wire", to excite gaseous species. The heating element 501 is positioned in either or both of the first reactive gas port and the second reactive gas port. The heating element 501 is connected to a power lead 323 (shown in FIG. 5) configured to cause a flow of current through the heating element 501 to heat the heating element 501. The heating element 501 is heated to high temperatures to excite the species in the gas passing adjacent the heating element 501. A purpose of the wire is to create the radical species in the gas, not to create a temperature increase in the substrate. The heating element 501 can be placed in a position in which there is no direct exposure to the surface of the substrate, while still being able to cause radical species formation in the gas. For example, if the heating element 501 is placed in the second reactive gas ports, then the element will cause a portion of the molecules in the second reactive gas to become excited. In the excited state the molecules have higher energy and are more likely to react with the substrate surface at a given processing temperature.

The placement of the heating element may have an impact on the amount of radical species contacting the substrate. Placing the heating element too far from the substrate may allow a larger number of radical species, than a closer placement, to become deactivated before contacting the substrate surface. The radical species may become deactivated by contact with other radicals, molecules in the gas stream and the gas distribution assembly. However, placing the heating element further from the substrate may help prevent the heating element from heating the substrate surface while still creating radical species in the gas. The heating element 501 may be placed close enough to the surface of the substrate to ensure that excited species exist long enough to contact the surface without causing significant change in local temperature of the substrate. As used in this specification and the appended claims, the term "significant change in local temperature" means that the portion of the substrate adjacent the wire does not have an increase in temperature greater than about 10° C. The heating element 501 can be positioned in an open channel 317 like that shown in FIG. 7, or behind a gas diffusing component. An embodiment of a gas diffusing component is also shown in FIG. 7 has a plurality of small spaced apertures which are placed at the exit region of the gas port The heating element 501 can be positioned behind the gas diffusing component is capable of exciting the gaseous species without significantly changing the local temperature of the substrate. In detailed embodiments, the wire is heated to excite gaseous species while causing a surface temperature change of less than about 10° C. In various embodiments, the local change in temperature of the substrate surface is less than about 7° C., 5° C. or 3° C. In specific embodiments, the local temperature change is less than about 2° C., 1° C. or 0.5° C.

The heating element can be made of any suitable material capable of being elevated to high temperature in a relatively short period of time. A suitable material is one which is compatible with the reactive gases. As used in this specification and the appended claims, the term "compatible" used in this regard means that the heating element is not spontaneously reactive with the reactive gas at standard temperature and pressure. The temperature of the heating element may have an impact on the degree of radicalization of the gaseous species. For example, oxygen may require temperature up to about 2000° C., while polymeric species may only need temperatures in the range of about 300° C. to about 500° C. In some embodiments, the heating element is capable of being heated to a temperature of at least about 1000° C., 1100° C., 1200° C., 1300° C., 1400° C., 1500° C., 1600° C., 1700° C., 1800° C., 1900° C. or 2000° C. In various embodiments, the heating element is capable of being heated to a temperature in the range of about 300° C. to about 2000° C., or in the range of about 700° C. and about 1400° C., or in the range of about 800° C. to about 1300° C. Power supplied to the heating element can be modulated or turned on and off at any point throughout the processing. This allows the heating element to be heated, creating excited gaseous species, for only a portion of the processing.

The thickness and length of the heating element can also be changed depending on the material used. Examples of suitable materials for the heating element include, but are not limited to, tungsten, tantalum, iridium, ruthenium, nickel, chromium, graphite and alloys thereof. For example, where oxygen is the species being radicalized, the use of tantalum or tungsten may not be desired as these materials are sensitive to oxygen and may cause breakage of the wire. In detailed embodiments, the heating element comprises tungsten.

Referring back to FIG. 5, the power source can be any suitable power source capable of controlling current flow through the heating element. The power feedthrough 321 shown in FIG. 5 has a power lead 323 and provides both mechanical and electrical support for the heating element and allows the heating element to be placed in the path of the gas flow. The power feedthrough 321 is connected to the gas distribution assembly 310 through a mounting block 327 which may include an insulator to electrically isolate the power lead 323 and the heating element from the gas distribution assembly. The heating element in the embodiment of FIG. 5 extends through the first reactive gas channels and can be individual heating element or a single heating element which wraps around the second reactive gas channel.

The heating element 501 shown in FIG. 7 extends through the channel 317 with the ends of the heating element 501 in contact with the power leads 323, 324. However, in one or more embodiments of the invention, the heating element is part of a separate assembly which can be inserted into the channel 317 or attached to the output face 303 of the gas distribution assembly 310. Accordingly, with reference to FIG. 8, one or more embodiments of the invention are directed to such an assembly 600. The assembly 600 shown comprises an elongate enclosure 605 which extends along a longitudinal axis 630. The elongate enclosure has an open interior region 606 which can allow a flow of gases to pass through the enclosure 605. The gas flow, shown as arrows 630 can pass through the enclosure in a direction substantially perpendicular to the longitudinal axis. As used in this specification and the appended claims, the term "substantially perpendicular" means that the flow of gas passes through the enclosure and around the heating element 601 at an obtuse angle. Those skilled in the art will understand that the gas flow can be at an angle other than 90° to the enclosure and still be within the meaning of "substantially perpendicular". In some embodiments, the gas flow is substantially perpendicular to the enclosure, forming an angle greater than about 25°, 30°, 35°, 40°, 45°, 50°, 55°, 60°, 65°, 70°, 75°, 80° or 85°. In some embodiments, the gas flow forms an angle relative to the enclosure in the range of about 25° to about 90°, or in the range of about 45° to about 90°, or in the range of about 60° to about 90°, or in the range of about 75° to about 90° or in the range of about 80° to about 90°.

The enclosure 605 shown has flat faces 611 on both sides and the sides 613 have a substantially uniform thickness from one end of the enclosure 605 to the other end. However, it will be understood by those skilled in the art that the shape and approximate dimensions shown are merely exemplary and should not be taken as limiting the scope of the invention.

The enclosure 605 is made from a material which is substantially resistant to thermal expansion at temperatures experienced in the processing chamber. As used in this specification and the appended claims, the term "substantially resistant to thermal expansion" means that the overall length of the enclosure 605 does not change by more than about 5% at temperatures required to radicalize the desired gaseous species. In various embodiments, the overall length of the enclosure does not change by more than about 4%, 3%, 2%, 1% or 0.5% relative to the length of the enclosure 605 at room temperature. In detailed embodiments, the enclosure is made of a quartz or ceramic based material, including quartz and ceramic. As used in this specification and the appended claims, the term "ceramic" refers to an inorganic, non-metallic material. Suitable examples of ceramics include, but are not limited to, alumina, beryllia, ceria, zirconia, carbides, borides, nitrides, silicides, composite materials, oxides and nonoxides of these materials. The thickness of the heating element can be uniform or varying in thickness. In some embodiments, the heating element is a wire with a cross-sectional diameter in the range of about 0.01 mm to about 5 mm. The heating element of some embodiments has a varying density/unit length.

A heating element 601 extends from a first end 620 to a second end 622 of the elongate enclosure 605. As has been described, the heating element 601 comprises a material suitable for heating by electrical current. The embodiment shown in FIG. 8 includes at least one electrical lead 610, shown as two leads, in electrical communication, or electrical contact, with the heating element 601 to allow current flow through the heating element 601. The electrical leads 610 can interact with electrical contacts positioned on the gas distribution assembly. For example, pairs of electrical contacts (positive and negative contacts) can be included in the channels of the gas distribution assembly or on the surface of the gas distribution assembly. Each of these electrical contact pairs can be powered individually or as one or more units. In detailed embodiments, the at least one electrical lead 610 does not substantially increase in temperature with application of electrical current to the heating element. In specific embodiments, the at least one electrical lead 610 does not substantially result in expansion of the enclosure 605.

Figure 8:
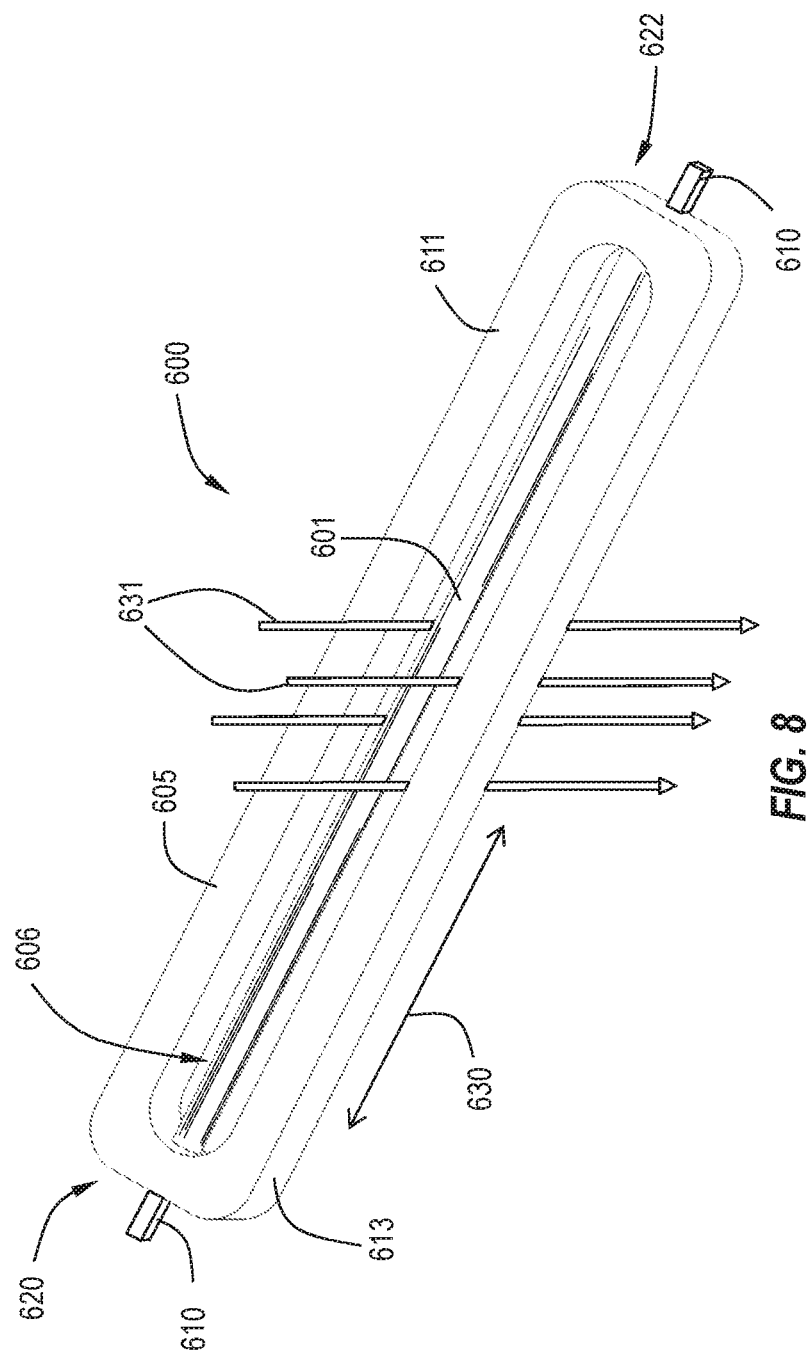
FIG. 8 shows a perspective view of a wire enclosure for use with gas distribution assemblies in accordance with one or more embodiments of the invention.

Although two separate electrical leads 610 are shown in FIG. 8, is will be understood that there can be only one electrical lead 610 positioned on either end of the enclosure. In embodiments, of this sort, the heating element 601 may extend through the enclosure 605 and present a portion that extends beyond the end of the enclosure. For example, FIG. 9 shows an embodiment of an assembly 700 in which the heating element 701 comprises a portion 730 that extends beyond one or more of the first end 720 and the second end 722 of the elongate enclosure 705. The extended portion 730 can act as an electrical lead.

When heated, the heating element can expand, resulting in sagging of the heating element. This decreases the efficiency of the radicalization and allows the heating element to become closer to the substrate, which heats the substrate. This sag may not be desirable. To minimize the sagging of the heating element, one or more end of the heating element may be held in a tensioner (not shown). The tensioner pulls the end of the heating element to minimize sagging. The amount of tension applied of the heating element can be constant or dynamic. In a dynamic tensioning environment, as the heating element get hot and lengthens, the amount of tension on the heating element is increased to prevent sagging.

Figure 11:
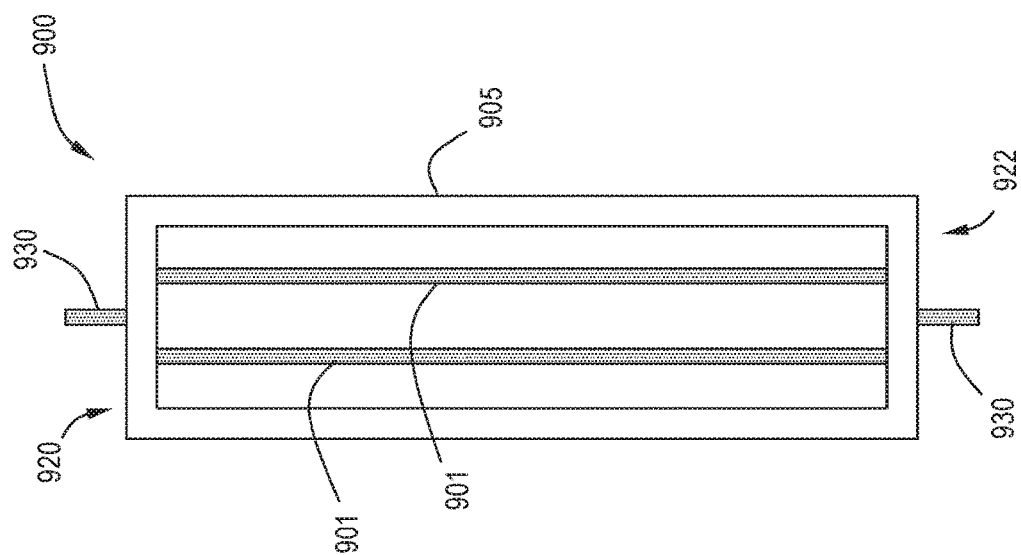
FIG. 11 shows a view of an assembly in accordance with one or more embodiments of the invention.

The heating element can have any suitable shape and is not limited to the shapes embodied by the drawings. Suitable shapes include, but are not limited, straight, sinusoidal, helical, curved, accordion and square-wave shaped. In detailed embodiments, as shown in FIG. 9, the heating element extends 701 from the first end 720 to the second end 722 of the enclosure 705 in a substantially straight path. FIG. 10 shows another embodiment of an assembly 800 in which the heating element 801 extends in a helical path. The number of turns and the tightness of the helix can be varied and should not be taken as limited to the shape shown in the figures. FIG. 11 shows another assembly 900 in which there are two heating elements 901 extending between the first end 920 and the second end 922 of the enclosure 905. FIG. 11 shows a single extension 930 for each end of the heating element 901 in electrical connection with the heating elements, but it will be understood that there can be an extension for each heating element 901. Additionally, there can be any number of individual heating elements and it will be understood that the shape of each element can be different, with mixtures of shapes possible.

Figure 12:
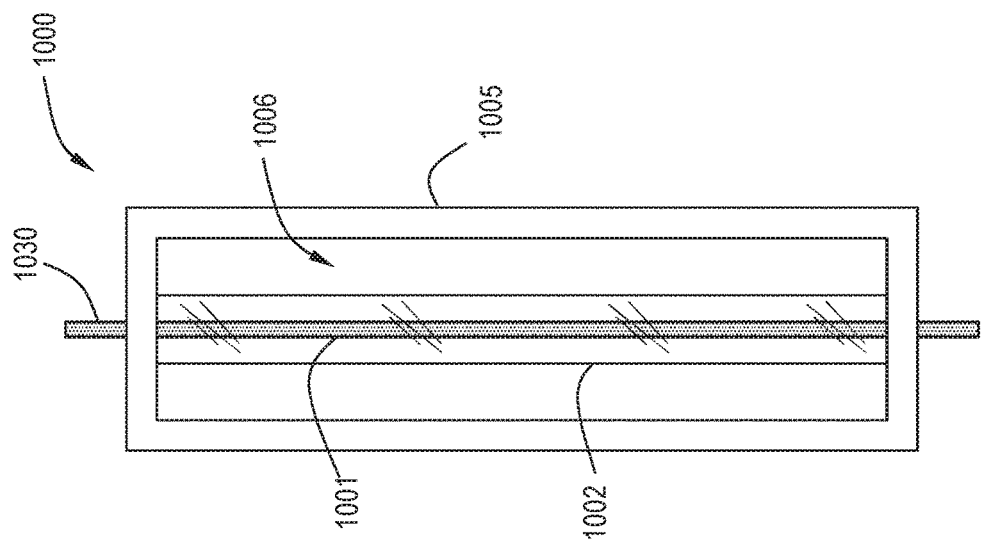
FIG. 12 shows a view of an assembly in accordance with one or more embodiments of the invention.

FIG. 12 shows another embodiment of an assembly 1000 in which the heating element 1001 is encapsulated in an outer housing 1002. Upon application of current, the heating element 1001 increases temperature and heats the outer housing 1002. The outer housing 1002 being exposed to the gas flowing through the interior region 1006 of the enclosure. Embodiments of this sort may be of particular use where the heating element 1001 is incompatible with the gas flowing through the interior region 1006. In detailed embodiments, the outer housing 1002 is a material capable of being heated by the heating element 1001 without becoming deformed. In specific embodiments, the outer housing 1002 comprises quartz.

The assemblies of various embodiments can be sized to fit within the channels of a gas distribution assembly so that the heating element can be easily added or removed from the gas distribution assembly. FIG. 13 shows an embodiment where the elongate enclosure 1105 is sized to fit within a gas port of the gas distribution assembly 310. Incorporating the heating element 501 into the enclosures 1000 allows the heating element 501 to be easily removed from the processing chamber to be replaced or cleaned. While the embodiment shown has an open channel 317, it will be understood that there can be a diffuser between the heating element and the substrate.

Referring to the bottom portion of FIG. 13, there is another embodiment shown where the elongate enclosure 1155 is configured to be attached to a front face 303 of a gas distribution assembly 310. The enclosure 1155 can be positioned such that gas from a gas port passes through the open interior region 1156 of the enclosure 1155 and the assembly does not substantially interfere with a flow of gas from an adjacent gas port. The enclosure 1155 is powered by connections 1123, 1124 as described above.

Figure 14:
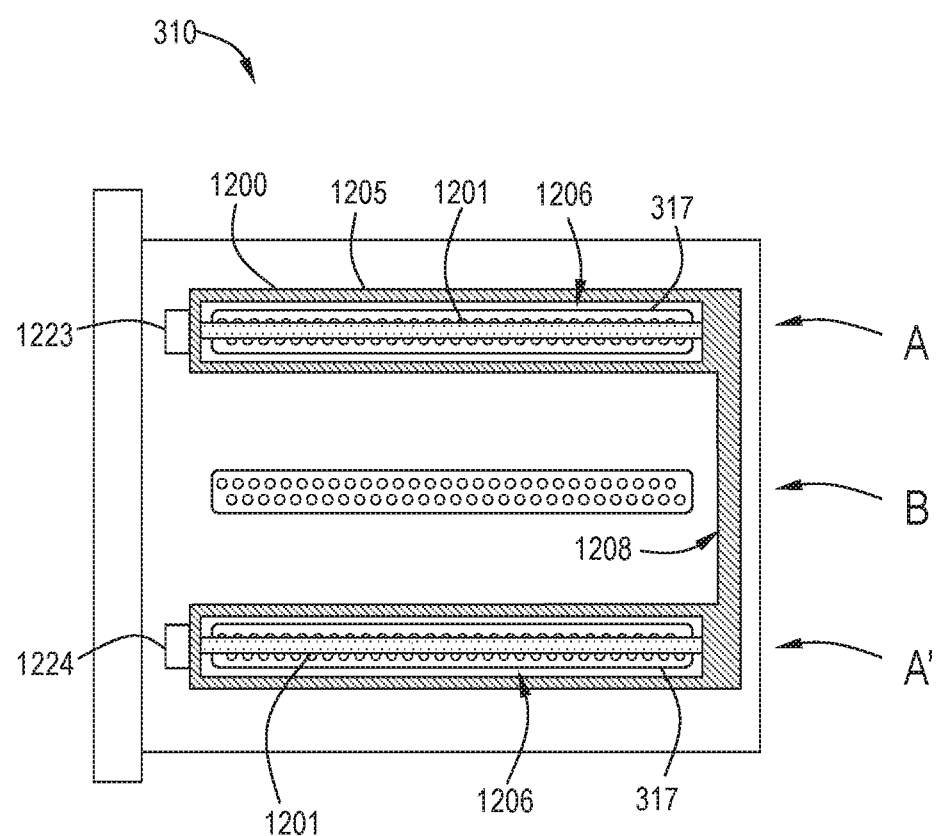
FIG. 14 shows a cross-sectional view of a gas distribution assembly in accordance with one or more embodiments of the invention.

The heating elements shown in FIG. 14 are shown as straight assemblies. However, the shape of the assembly can be changed depending on the desired use. FIG. 14 shows another embodiment of the invention in which the assembly 1200 covers two channels 317 with a single heating element 1201. The assembly 1200 comprises an elongate enclosure 1205 with two open interior regions 1206 positioned over the channels 317. The heated element 1201 is connected to power leads 1223, 1224. The heated element 1201 of this embodiment can turn through the enclosure 1205 in an insulated portion 1208 where the heated element 1201 is not exposed to gas flows. In some embodiments, the heated element 1201 is exposed throughout the entire path. Stated differently, the open interior region can match the shape of the enclosure with portions of the heated element 1201 not positioned in front of gas ports.

In embodiments of the sort shown in FIG. 14, the power leads 1223, 1224 are of opposite polarity to allow current flow. Therefore, one power lead will be positive and other negative. This configuration may be relatively easy to setup, with a single power source being connected to both of the power leads 1223, 1224. The single power source (not shown) may include a mechanism to control the current flowing through the wire, such as a potentiometer.

Some embodiments of the gas distribution assembly comprise a plurality of elongate gas ports consisting essentially of, in order, at least two repeating units of alternating first reactive gas A ports and second reactive gas B ports followed by a trailing first reactive gas A' port. Stated differently, a combination of a first reactive gas A port and a second reactive gas B port, which may be referred to as an AB unit, is repeated at least two times, with a trailing first reactive gas A' port. Those skilled in the art will understand that the purge, vacuum and plurality of openings may be present in the gas distribution assembly.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

A tungsten nucleation layer as described above has shown particular utility when integrated with traditional bulk fill techniques to form features with excellent film properties. An integration scheme can include ALD or pulsed-CVD processes to deposit a nucleation layer while a bulk layer may be deposited by CVD or PVD processes. Integrated processing systems capable of performing such an integration scheme include an Endura™, Endura SL™, Centura™ and Producer™ processing systems, each available from Applied Materials, Inc. located in Santa Clara, Calif. Any of these systems can be configured to include at least one ALD or pulsed-CVD chamber for depositing the nucleation layer and at least one CVD chamber or PVD chamber for bulk fill.

Figure 15A:
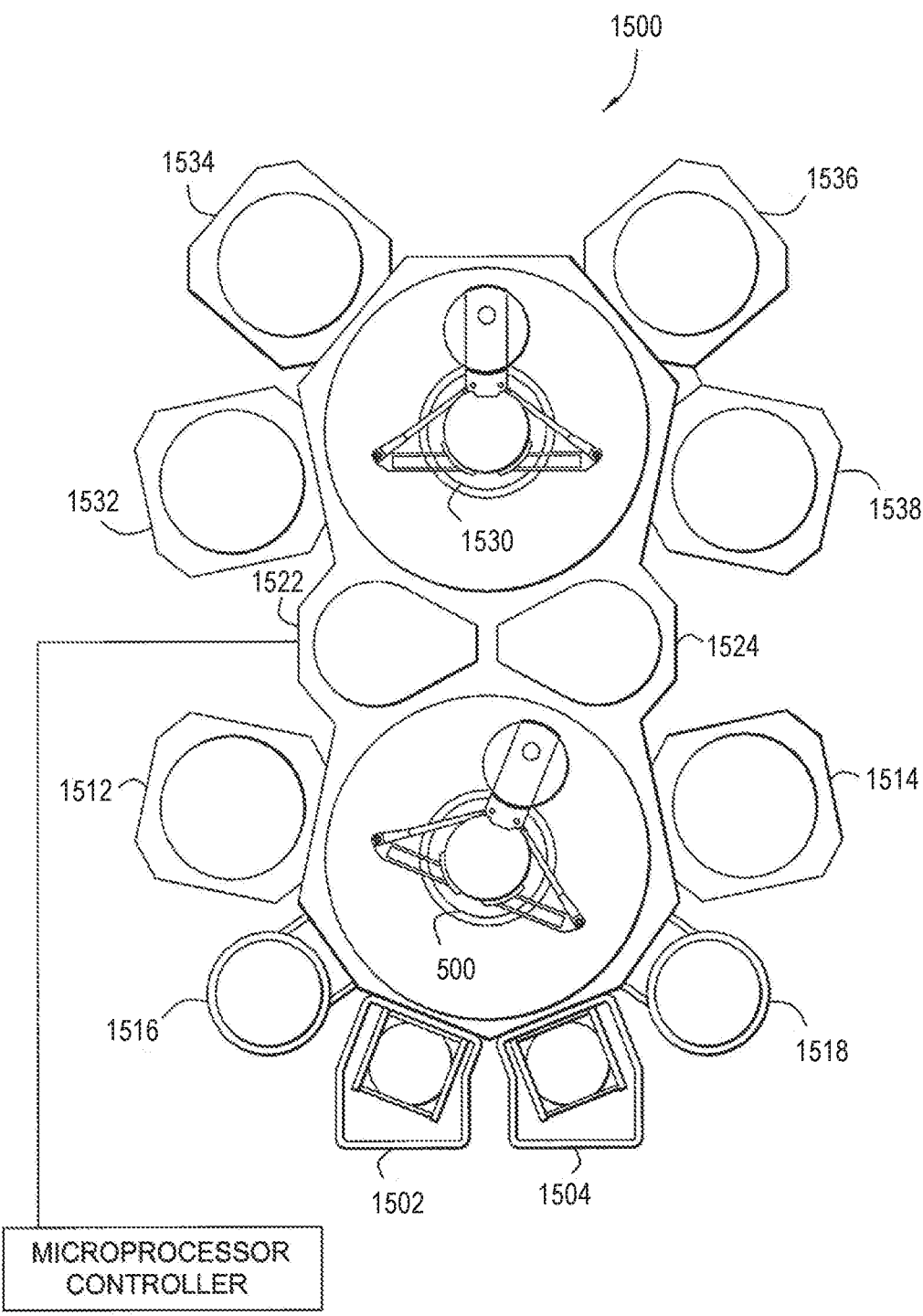
FIG. 15A shows an exemplary integrated processing platform.

FIG. 15A is a schematic top-view diagram of an exemplary multi-chamber processing system 1500. A similar multi-chamber processing system is disclosed in commonly assigned U.S. Pat. No. 5,186,718, which is incorporated by reference herein. The system 1500 generally includes load lock chambers 1502, 1504 for the transfer of substrates into and out from the system 1500. Typically, since the system 1500 is under vacuum, the load lock chambers 1502, 1504 may "pump down" the substrates introduced into the system 1500. A first robot 1510 may transfer the substrates between the load lock chambers 1502, 1504, and a first set of one or more substrate processing chambers 1512, 1514, 1516, 1518 (four are shown). Each processing chamber 1512, 1514, 1516, 1518, can be outfitted to perform a number of substrate processing operations such as cyclical layer deposition, CVD, PVD, etch, pre-clean, de-gas, orientation and other substrate processes. The first robot 1510 also transfers substrates to/from one or more transfer chambers 1522, 1524.

The transfer chambers 1522, 1524, are used to maintain ultrahigh vacuum conditions while allowing substrates to be transferred within the system 1500. A second robot 1530 may transfer the substrates between the transfer chambers 1522, 1524 and a second set of one or more processing chambers 1532, 1534, 1536, 1538. Similar to processing chambers 1512, 1514, 1516, 1518, the processing chambers 1532, 1534, 1536, 1538 can be outfitted to perform a variety of substrate processing operations, such as cyclical deposition, CVD, PVD, etch, pre-clean, de-gas, and orientation, for example. Any of the substrate processing chambers 1512, 1514, 1516, 1518, 1532, 1534, 1536, 1538 may be removed from the system 1500 if not necessary for a particular process to be performed by the system 1500.

In one arrangement, each processing chamber 1532 and 1538 may be a cyclical deposition chamber adapted to deposit a nucleation layer; each processing chamber 1534 and 1536 may be a cyclical deposition chamber, a chemical vapor deposition chamber or a physical vapor deposition chamber adapted to form a bulk layer; each processing chamber 1512 and 1514 may be a physical vapor deposition chamber, a chemical vapor deposition chamber, or a cyclical deposition chamber adapted to deposit a dielectric layer; and each processing chamber 1516 and 1518 may be an etch chamber outfitted to etch apertures or openings for interconnect features. This one particular arrangement of the system 1500 is provided to illustrate the invention and should not be used to limit the scope of the invention.

Another integrated system may include nucleation deposition as well as bulk fill deposition in a single chamber. A chamber configured to operate in both a cyclical deposition mode as well as a conventional CVD mode can be used. One example of such a chamber is described in commonly assigned U.S. patent application Ser. No. 10/016,300, filed on Dec. 12, 2001, which is incorporated herein by reference.

In another integration scheme, one or more cyclical deposition nucleation chambers are integrated onto a first processing system while one or more bulk layer deposition chambers are integrated onto a second processing system. In this configuration, substrates are first processed in the first system where a nucleation layer is deposited on a substrate. Thereafter, the substrates are moved to the second processing system where bulk deposition occurs.

Figure 15B:
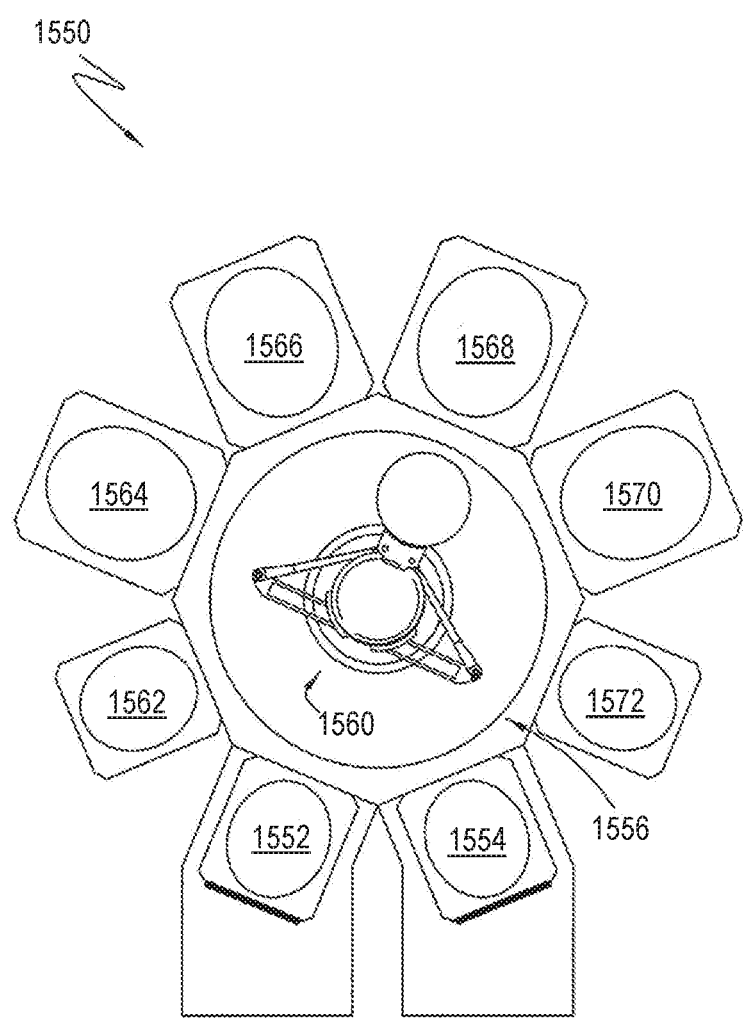
FIG. 15B shows another exemplary integrated processing platform.

FIG. 15B is a schematic top-view diagram of an exemplary multi-chamber processing system 1550. The system 1550 generally includes load lock chambers 1552, 1554 for the transfer of substrates into and out from the system 1550. Typically, since the system 1550 is under vacuum, the load lock chambers 1552, 1554 may "pump down" the substrates introduced into the system 1550. A robot 1560 may transfer the substrates between the load lock chambers 1552, 1554, and substrate processing chambers 1562, 1564, 1566, 1568, 1570 and 1572. Each processing chamber 1562, 1564, 1566, 1568, 1570 and 1572 can be outfitted to perform a number of substrate processing operations such as cyclical layer deposition, CVD, PVD, etch, pre-clean, de-gas, heat, orientation and other substrate processes. The robot 1560 also transfers substrates to/from a transfer chamber 1556. Any of the substrate processing chambers 1562, 1564, 1566, 1568, 1570 and 1572 may be removed from the system 1550 if not necessary for a particular process to be performed by the system 1550.

In one arrangement, each processing chamber 1564 and 1570 may be a cyclical deposition chamber adapted to deposit a nucleation layer; each processing chamber 1566 and 1568 may be a cyclical deposition chamber, a chemical vapor deposition chamber or a physical vapor deposition chamber adapted to form a bulk fill deposition layer. This one particular arrangement of the system 1550 is provided to illustrate the invention and should not be used to limit the scope of the invention.

Alternatively, a carousel type batch processing system having a plurality of stations in a single chamber can be adapted to incorporate nucleation and bulk layer deposition into a single processing system. In such a processing system a purge gas curtain, such as an argon gas curtain, can be established between each station creating a micro or mini environment at each station. The substrates are loaded into the system sequentially and then rotated through each station and processed at least partially at each station. For example, a substrate may be exposed to a cyclical deposition nucleation step at a first station and then to partial bulk fill CVD steps at each of the subsequent stations. Alternatively, nucleation may occur at more than one station and bulk fill may occur at one or more stations. Still further, the nucleation layer and the bulk layer may be deposited in separate carousel type systems. In another aspect, the soak and the nucleation steps are completed in one carousel while the bulk steps are done on another carousel, wherein both carousels are part of the same process system. Each platen can be temperature controlled to provide at least some process control at each station. However, the process pressure typically remains the same between stations because the stations are housed in a single chamber. Some pressure control may be available in a micro or mini environment present at each station due to the inert gas curtain.

Regardless of the integration scheme, the nucleation layer is typically deposited to a thickness in a range from about 10 Å to about 200 Å and the bulk layer has a thickness in a range from about 100 Å to about 10,000 Å, preferably in the range from about 1,000 Å to about 5,000 Å. However, the thickness of these films can vary depending on the feature sizes and aspect ratios of a given application. Accordingly, the films are suitably sized to accommodate the geometries of a given application. The following are some exemplary geometries and applications that can benefit from a nucleation layer deposited according to embodiments described herein. The following descriptions are intended for illustrative purposes only, and are not intended to limit the uses of the present invention.

Figure 16:
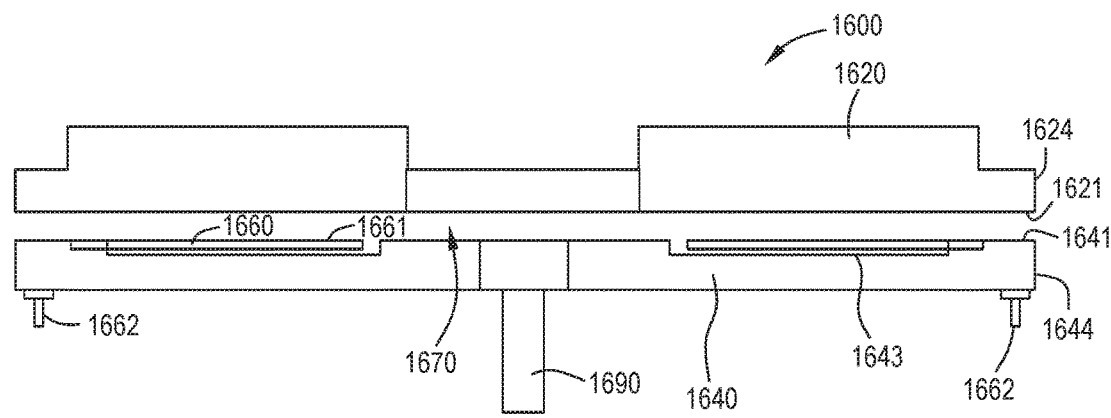
FIG. 16 shows a schematic cross-section view of a batch processing chamber for use with embodiments of the invention.

FIG. 16 shows cross-section of a processing chamber 1600 including a gas distribution assembly 1620, also referred to as injectors or an injector assembly, and a susceptor assembly 1640. The gas distribution assembly 1620 is any type of gas delivery device used in a processing chamber. The gas distribution assembly 1620 includes a front surface 1621 which faces the susceptor assembly 1640. The front surface 1621 can have any number or variety of openings to deliver a flow of gases toward the susceptor assembly 1640. The gas distribution assembly 1620 also includes an outer edge 1624 which, in the embodiments, shown, is substantially round.

The specific type of gas distribution assembly 1620 used can vary depending on the particular process being used. Embodiments of the invention can be used with any type of processing system where the gap between the susceptor and the gas distribution assembly is controlled. While various types of gas distribution assemblies can be employed (e.g., showerheads), embodiments of the invention may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, thereby forming a layer on the substrate surface.

In some embodiments, the gas distribution assembly 1620 is a rigid stationary body made of a single injector unit. In one or more embodiments, the gas distribution assembly 1620 is made up of a plurality of individual sectors 1622 (see FIG. 17). A gas distribution assembly having either a single piece body or a multi-sector body can be used with the various embodiments of the invention described.

The susceptor assembly 1640 is positioned beneath the gas distribution assembly 1620. The susceptor assembly 1640 includes an edge 1644, a top surface 1641 and a bottom surface 1643 defining a thickness. The top surface 1641 can include at least one recess 1642 sized to support a substrate for processing. The recess 1642 can be any suitable shape and size depending on the shape and size of the wafers 1660 being processed. In the embodiment shown in FIG. 16, the recess 1642 has a flat bottom to support the bottom of the wafer, but it will be understood that the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 16, the recess 1642 in the top surface 1641 of the susceptor assembly 1640 is sized so that a wafer 1660 supported in the recess 1642 has a top surface 1661 substantially coplanar with the top surface 1641 of the susceptor 1640. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 1640 of FIG. 16 includes a support post 1690 which is capable of lifting, lowering and rotating the susceptor assembly 1640. The susceptor assembly may include a heater, or gas lines, or electrical components within the center of the support post 1690. The support post 1690 may be the primary means of increasing or decreasing the gap between the susceptor assembly 1640 and the gas distribution assembly 1620. The susceptor assembly 1640 may also include fine tuning actuators 1662 which can make micro-adjustments to susceptor assembly 1640 to create a desired gap 1670 between the susceptor assembly 1640 and the gas injector assembly 1620.

In some embodiments, the gap 1670 distance during processing is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

Figure 17:
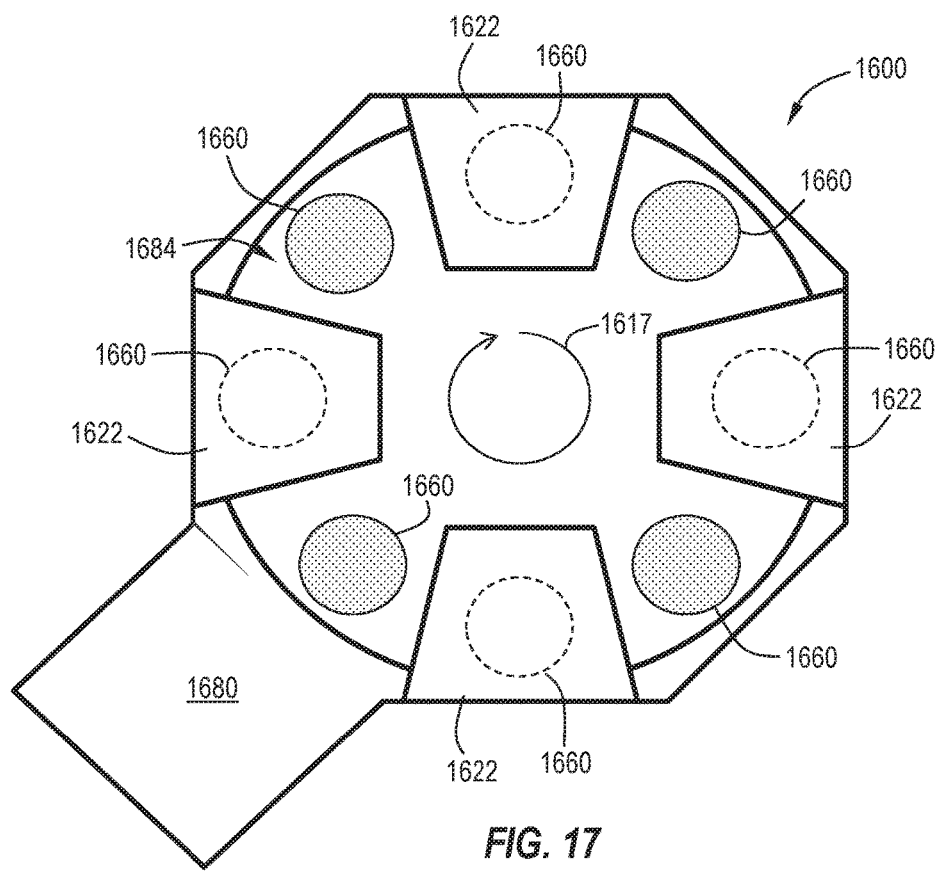
FIG. 17 shows a schematic of a batch processing chamber for use with embodiments of the invention.

The processing chamber 1600 shown in FIGS. 16 and 17 is a carousel-type chamber in which the susceptor assembly 1640 can hold a plurality of wafers 1660. As shown in FIG. 17, the gas distribution assembly 1620 may include a plurality of separate injector units 1622, each injector unit 1622 being capable of depositing a film on the wafer, as the wafer is moved beneath the injector unit. Four generally pie-shaped injector units 1622 are shown positioned on approximately opposite sides of and above the susceptor assembly 1640. This number of injector units 1622 is shown for illustrative purposes only. It will be understood that more or less injector units 1622 can be included. In some embodiments, there are a sufficient number of pie-shaped injector units 1622 to form a shape conforming to the shape of the susceptor assembly 1640. In some embodiments, each of the individual pie-shaped injector units 1622 may be independently moved, removed and/or replaced without affecting any of the other injector units 1622. For example, one segment may be raised to permit a robot to access the region between the susceptor assembly 1640 and gas distribution assembly 1620 to load/unload wafers 1660.

Similarly, although not shown, the susceptor assembly 1640 can be made up of a plurality of separate pieces or units. The plurality of units can be generally pie shaped and can be fitted together to form a susceptor assembly having a top surface and bottom surface.

The size of the susceptor assembly 1640 can be varied depending on the specific processing chamber and the size of the wafers to be processed. In some embodiments, the susceptor assembly is sized to support at least three wafers. In one or more embodiments, the susceptor assembly is sized to support at least 3, 4, 5, 6, 7, 8, 9, 10, 11, 12, 13, 14, 15, 16 or more wafers. The wafers can be any size wafer including, but not limited to, 150 mm, 200 mm, 300 mm and 450 mm wafers. The diameter of the susceptor assembly can also vary. In some embodiments, the susceptor assembly has a diameter in the range of about 0.75 meters to about 2 meters, or in the range of about 1 meter to about 1.75 meters of in the range of about 1.25 meters to about 1.75 meters or about 1.5 meters.

Processing chambers having multiple gas injectors can be used to process multiple wafers simultaneously so that the wafers experience the same process flow. For example, as shown in FIG. 17, the processing chamber 1600 has four gas injector units 1622 and four wafers 1660. The drawing of four injector units 1622 is merely representative and is chosen to allow easier view and description of the process. Those skilled in the art will understand that the gas distribution assembly can be a single component and can be approximately the same size and/or shape as the susceptor assembly. At the outset of processing, the wafers 1660 can be positioned between the injector units 1622. Rotating 1617 the susceptor assembly 1640 by 45° will result in each wafer 1660, which is between injector units 1622 to be moved to an injector units 1622 for film deposition, as illustrated by the dotted circle under the injector assemblies 1622. An additional 45° rotation would move the wafers 1660 away from the injector assemblies 1622. With spatial ALD injectors, a film is deposited on the wafer during movement of the wafer relative to the injector assembly. In some embodiments, the susceptor assembly 1640 is rotated in increments that prevent the wafers 1660 from stop beneath the injector units 1622. The number of wafers 1660 and injector units 1622 can be the same or different. In some embodiments, there are the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 1600 shown in FIG. 17 is merely representative of one possible configuration and should not be taken as limiting the scope of the invention. Here, the processing chamber 1600 includes a plurality of gas distribution assemblies 1620. In the embodiment shown, there are four gas distribution assemblies 1622 evenly spaced about the processing chamber 1600. The processing chamber 1600 shown is octagonal, however, it will be understood by those skilled in the art that this is one possible shape and should not be taken as limiting the scope of the invention. The gas distribution assemblies 1620 shown are trapezoidal, but it will be understood by those skilled in the art that the gas distribution assemblies can be a single circular component or made up of a plurality of pie-shaped segments having radiused inner and/or outer peripheral edges.

The embodiment shown in FIG. 17 includes a load lock chamber 1680, or an auxiliary chamber like a buffer station. This chamber 1680 is connected to a side of the processing chamber 1600 to allow, for example, the substrates 1660 to be loaded/unloaded from the chamber 1600. A wafer robot may be positioned in the chamber 1680 to move the substrate Rotation of the carousel (e.g., the susceptor assembly 1640) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

A first embodiment is directed to a processing method comprising sequentially exposing a substrate to a first reactive gas comprising a tungsten-containing compound comprising a compound with the empirical formula $W_xCl_{5x}$ and a second reactive gas to form a tungsten-containing film.

In a second embodiment, the first embodiment is modified wherein the second reactive gas comprises a hydrogen-containing compound and the tungsten-containing film is a tungsten film.

In a third embodiment, the first or second embodiments are modified wherein the second reactive gas comprises a nitrogen-containing compound and the tungsten-containing film comprises tungsten nitride.

In a fourth embodiment, any of the first through third embodiments are modified wherein the second reactive gas comprises a silicon-containing compound and the tungsten-containing film comprises tungsten silicide ($WSi_x$).

In a fifth embodiment, the first or fourth embodiment is modified wherein the second reactive gas further comprises hydrogen.

In a sixth embodiment, any of the first through fifth embodiments are modified wherein the second reactive gas comprises a mixture of a silicon-containing compound and a nitrogen-containing compound and the tungsten-containing film comprises tungsten-silicon-nitride ($WSi_xN_y$).

In a seventh embodiment, any of the first through sixth embodiments are modified wherein the substrate is maintained at a temperature less than about 475° C.

In an eighth embodiment, any of the first, second or seventh embodiment is modified wherein the tungsten-containing film consists essentially of tungsten.

In a ninth embodiment, the eighth embodiment is modified wherein the substrate comprises a work function metal.

In a tenth embodiment, the ninth embodiment is modified wherein the work function metal comprises Ti.

In an eleventh embodiment, any of the ninth or tenth embodiment is modified wherein the work function metal comprises TiAl.

In a twelfth embodiment, any of the eighth through eleventh embodiments are modified wherein there is no intervening layer between the work function metal and the film consisting essentially of tungsten.

In a thirteenth embodiment, any of the eighth through eleventh embodiments are modified wherein there is an intervening layer between the work function metal and the film consisting essentially of tungsten, the intervening layer have a thickness of less than about 5 Angstroms.

A fourteenth embodiment of the invention is directed to a processing method comprising: positioning a substrate in a processing chamber; and sequentially exposing at least a portion of the substrate to a first reactive gas and a second reactive gas at a temperature less than or equal to about 475°

C. to form a tungsten-containing film, the first reactive gas comprising one or more of tungsten pentachloride, a compound with the empirical formula WxCl5x or tungsten hexachloride.

In a fifteenth embodiment, the fourteenth embodiment is modified wherein the second reactive gas comprises a hydrogen-containing compound and the tungsten-containing film is a tungsten film.

In a sixteenth embodiment, any of the fourteenth or fifteenth embodiments are modified wherein the second reactive gas comprises a nitrogen-containing compound and the tungsten-containing film comprises tungsten nitride.

In a seventeenth embodiment, any of the fourteenth through sixteenth embodiments are modified wherein the second reactive gas comprises a silicon-containing compound and the tungsten-containing film comprises tungsten silicide ($WSi_x$).

In an eighteenth embodiment, the seventeenth embodiment is modified wherein the second reactive gas further comprises hydrogen.

In a nineteenth embodiment, any of the fourteenth through eighteenth embodiments are modified wherein the second reactive gas comprises a mixture of a silicon-containing compound and a nitrogen-containing compound and the tungsten-containing film comprises tungsten-silicon-nitride ($WSi_xN_y$).

In a twentieth embodiment, any of the fourteenth through nineteenth embodiments are modified wherein prior to deposition of the tungsten-containing film, the substrate comprises a metallic layer.

In a twenty-first embodiment, any of the fourteenth through twentieth embodiments are modified wherein prior to deposition of the tungsten-containing film, the substrate comprises an oxide layer and the method further comprises soaking the substrate with disilane or a mixture of hydrogen and silane at a partial pressure in the range of about 5 to about 20 Torr.

In a twenty-second embodiment, any of the fourteenth through twenty-first embodiments are modified wherein the tungsten containing film grows at a rate in the range of about 0.2 Å/cycle and about 3 Å/cycle.

A twenty-third embodiment of the invention is directed to a method of depositing a $WSi_x$ film. The method comprising: positioning a substrate in a processing chamber; and sequentially exposing at least a portion of the substrate to a first reactive gas and a second reactive gas at a temperature less than or equal to about 475° C. to form the $WSi_x$ film, wherein the first reactive gas comprises one or more of tungsten pentachloride, a compound with the empirical formula WxCl5x or tungsten hexachloride and the second reactive gas comprises a silicon-containing gas, the ratio of the silicon-containing gas to the tungsten-containing gas in the range of about 100:2 and about 100:0.2.

In a twenty-fourth embodiment, the twenty-third embodiment is modified wherein the silicon-containing gas comprises one or more of silane and disilane and the second reactive gas further comprises hydrogen.

In a twenty-fifth embodiment, any of the twenty-third through twenty-fourth embodiments are modified to further comprise exposing at least a portion of the substrate to a hydrogen-containing gas instead of the silicon-containing gas on alternate cycles.

In a twenty-sixth embodiment, the twenty-fifth embodiment is modified wherein the substrate is exposed to the hydrogen-containing gas prior to being exposed to the silicon-containing gas.

A twenty-seventh embodiment of the invention is directed to an integrated circuit transistor device comprising: a dielectric layer disposed over a channel; a work function metal disposed over the dielectric layer; and a fill layer disposed over the work function layer, the fill layer consisting essentially of W.

In a twenty-eighth embodiment, the twenty-seventh embodiment is modified wherein the work function layer comprises Ti.

In a twenty-ninth embodiment, any of the twenty-seventh through twenty-eighth embodiments are modified wherein the work function layer comprises TiAl.

In a thirtieth embodiment, any of the twenty-eighth or twenty-ninth embodiments are modified wherein the work function metal contains substantially no fluorine.

In a thirty-first embodiment, any of the twenty-seventh through thirtieth embodiments are modified wherein the fill layer contains substantially no fluorine.

In a thirty-second embodiment, any of the twenty-seventh through thirty-first embodiments are modified wherein the fill layer consisting essentially of W is an ALD W layer.

In a thirty-third embodiment, the thirty-second embodiment is modified wherein the ALD W layer is formed by sequential exposures of WxCl5x and a second reactive gas comprising a hydrogen-containing compound.

In a thirty-fourth embodiment, any of the twenty-seventh through thirty-third embodiments are modified wherein there is no intervening layer between the work function metal and the film consisting essentially of tungsten.

In a thirty-fifth embodiment, any of the twenty-seventh through thirty-third embodiments are modified wherein there is an intervening layer between the work function metal and the film consisting essentially of tungsten, the intervening layer have a thickness of less than about 5 Angstroms.

In a thirty-sixth embodiment, any of the twenty-seventh through thirty-fifth embodiments are modified wherein the fill layer is CVD W, and the CVD W is formed by simultaneous exposures of $W_xCl_{5x}$ and a second reactive gas comprising a hydrogen-containing compound.

A thirty-seventh embodiment of the invention is directed to a processing method comprising sequentially exposing at least a portion of substrate in a processing chamber to a first reactive gas comprising a tungsten-containing compound having the empirical formula $WCl_5$ or $WCl_6$ and a second reactive gas comprising hydrogen radicals to form a tungsten-containing film.

In a thirty-eighth embodiment, the thirty-seventh embodiment further comprises generating the hydrogen radicals from hydrogen gas.

In a thirty-ninth embodiment, the thirty-eighth embodiment is modified wherein generating the hydrogen radicals from hydrogen gas comprises passing the hydrogen gas across a heating element having a temperature sufficient to create hydrogen radicals.

In a fortieth embodiment, the thirty-ninth embodiment further comprises heating the heating element to the temperature sufficient to create hydrogen radicals.

In a forty-first embodiment, the fortieth embodiment is modified wherein heating the heating element comprises providing a flow of electrical current through the heating element.

In a forty-second embodiment, any of the fortieth and forty-first embodiments further comprises applying dynamic tension to ends of the heating element to prevent the heating element from sagging at the temperature sufficient to create hydrogen radicals.

In a forty-third embodiment, any of the fortieth through forty-second embodiments, are modified wherein the heating element is contained within an enclosure substantially resistant to thermal expansion.

In a forty-fourth embodiment, any of the thirty-seventh through forty-third embodiments are modified wherein the first reactive gas and the second reactive gas are flowed into the processing chamber at the same time.

In a forty-fifth embodiment, any of the thirty-seventh through forty-fourth embodiments are modified wherein the first reactive gas and the second reactive gas are flowed into the processing chamber through a gas distribution assembly comprising adjacent elongate gas ports, the first reactive gas and the second reactive gas flowing through different elongate gas ports being separated by at least one of a purge gas port and a vacuum port.

In a forty-sixth embodiment, any of the thirty-ninth through forty-fifth embodiments are modified wherein the heating element is positioned within the second reactive gas port.

In a forty-seventh embodiment, any of the thirty-ninth through forty-fifth embodiments are modified wherein the heating element is contained within a enclosure substantially resistant to thermal expansion.

In a forty-eighth embodiment, the forty-seventh embodiment is modified wherein the enclosure is affixed to a front surface of gas distribution assembly so that the second reactive gas flowing from the second reactive gas ports flows through the enclosure and around the heating element.

In a forty-ninth embodiment, any of the forty-fifth through forty-eighth embodiments further comprise moving the substrate relative to the gas distribution assembly so that each portion of the substrate is exposed to a flow of gases consisting essentially of, in order, the first reactive gas and the second reactive gas.

In a fiftieth embodiment, any of the thirty-seventh through forty-ninth embodiments are modified wherein the substrate is maintained at a temperature less than about 475° C.

A fifty-first embodiment is directed to a processing method comprising: positioning a substrate in a processing chamber comprising a gas distribution assembly including a plurality of elongate gas ports including a first reactive gas port and second reactive gas port, the first reactive gas port in fluid communication with a first reactive gas comprising a tungsten-containing compound with the empirical formula WCl5 or WCl6 and the second reactive gas port in fluid communication with a second reactive gas comprising hydrogen, the gas distribution assembly flowing both the first reactive gas and the second reactive gas into the processing chamber simultaneously; passing the second reactive gas across a heating element to generate hydrogen radicals in the second reactive gas; and sequentially exposing at least a portion of the substrate to the first reactive gas and the hydrogen radicals in the second reactive gas to form a tungsten film on the substrate.

In a fifty-second embodiment, the fifty-first embodiment is modified wherein the heating element is contained within a enclosure substantially resistant to thermal expansion, the enclosure affixed to a front face of the gas distribution assembly, so that the second reactive gas flows through the enclosure.

In a fifty-third embodiment, any of the fifty-first through fifty-second embodiments are modified wherein prior to deposition of the tungsten film, the substrate comprises a metallic layer.

In a fifty-fourth embodiment, any of the fifty-first through fifty-third embodiments are modified wherein prior to the deposition of the tungsten film, the substrate comprises an oxide layer and the method further comprises soaking the substrate with disilane or a mixture of hydrogen and silane at a partial pressure in the range of about 5 Torr to about 20 Torr.

In a fifty-fifth embodiment, any of the fifty-first through fifty-fourth embodiments are modified wherein the tungsten film grows at a rate in the range of about 0.2 Å/cycle and about 3 Å/cycle.

In a fifty-sixth embodiment, any of the fifty-first through fifty-fifth embodiments are modified wherein sequentially exposing at least a portion of the substrate to the first reactive gas and the hydrogen radicals in the second reactive gas comprises moving the substrate relative to the gas distribution assembly so that each portion of the substrate is exposed to a flow of gases consisting essentially of, in order, the first reactive gas and the hydrogen radicals.

A fifty-seventh embodiment of the invention is directed to a processing method comprising: soaking a substrate with silane; and sequentially exposing the substrate previously soaked with silane to a first reactive and a second reactive gas, the first reactive gas comprising a tungsten-containing compound comprising a compound with the empirical formula $W_xCl_{5x}$ and hydrogen, the second reactive gas comprising a reductant to form a tungsten film.

In a fifty-eighth embodiment, the fifty-seventh embodiment is modified wherein the second reactive gas comprises a hydrogen-containing compound.

In a fifty-ninth embodiment, any of the fifty-seventh through fifty-eight embodiments are modified wherein the substrate is maintained at a temperature greater than about 350° C.

In a sixtieth embodiment, any of the fifty-seventh through fifty-ninth embodiments are modified wherein when the tungsten film has a thickness of about 70 Å, the tungsten film has a grain size greater than about 60 Å.

In a sixty-first embodiment, any of the fifty-seventh through sixtieth embodiments are modified wherein when the tungsten film has a thickness of about 200 Å, the tungsten film has a resistivity less than about 30 µΩ·cm.

In a sixty-second embodiment, any of the fifty-seventh through sixty-first embodiments are modified wherein the first reactive gas comprises more hydrogen than tungsten on an atomic basis.

In a sixty-third embodiment, any of the fifty-seventh through sixty-second embodiments are modified wherein the first reactive gas comprises the tungsten containing compound and the hydrogen are present in a ratio in the range of about 1:2 to 1:20.

A sixty-fourth embodiment of the invention is directed to a method of forming a conformal tungsten film comprising sequentially exposing a surface to a first reactive gas comprising a tungsten-containing compound for a first time and a second reactive gas comprising hydrogen for a second time, the first time and the second time being less than about 2 second to deposit a tungsten film.

In a sixty-fifth embodiment, the sixty-fourth embodiment is modified wherein the tungsten film is grown at a rate less than about 1 Å/cycle.

In a sixty-sixth embodiment, any of the sixty-fourth through sixty-fifth embodiments are modified wherein the tungsten film is grown at a rate less than about 0.8 Å/cycle.

A sixty-eighth embodiment is directed to an integrated circuit transistor device comprising: a dielectric layer disposed over a channel; and a work function layer on the dielectric layer consisting essentially of tungsten.

A sixty-ninth embodiment of the invention is directed to a processing method comprising: (a) depositing a thickness of tungsten as a fill material on a work function material in a transistor; (b) treating the deposited tungsten film; and (c) repeating (a) and (b) to form a tungsten fill of a desired thickness, wherein treating the tungsten film comprises one or more of (1) sequentially exposing the fill material to titanium tetrachloride and ammonia; (2) soaking the fill material in titanium tetrachloride; and (3) exposing the fill material to a hydrogen plasma for a time in the range of about 10 seconds to about 30 seconds.

In a sixty-ninth embodiment, the sixty-eighth embodiment is modified wherein the thickness of tungsten deposited as a fill material in (a) is in the range of about 10 Å to about 30 Å.

In a seventieth embodiment, any of the sixty-eighth through sixty-ninth embodiments are modified wherein the amount of TiN is less than about ½ a monolayer thick.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
   positioning a substrate in a processing chamber comprising a gas distribution assembly including a plurality of elongate gas ports including a first reactive gas port and second reactive gas port, the first reactive gas port in fluid communication with a first reactive gas comprising a tungsten-containing compound with the empirical formula $WCl_5$ or $WCl_6$ and the second reactive gas port in fluid communication with a second reactive gas comprising hydrogen, the gas distribution assembly flowing both the first reactive gas and the second reactive gas into the processing chamber simultaneously;
   passing the second reactive gas across a heating element to generate hydrogen radicals in the second reactive gas; and
   sequentially exposing at least a portion of the substrate to the first reactive gas and the hydrogen radicals in the second reactive gas to form a tungsten film on the substrate.

2. The method of claim 1, wherein the heating element is contained within a enclosure substantially resistant to thermal expansion, the enclosure affixed to a front face of the gas distribution assembly, so that the second reactive gas flows through the enclosure.

3. The method of claim 1, wherein prior to deposition of the tungsten film, the substrate comprises a metallic layer.

4. The method of claim 1, wherein prior to the deposition of the tungsten film, the substrate comprises an oxide layer and the method further comprises soaking the substrate with disilane or a mixture of hydrogen and silane at a partial pressure in the range of about 5 Torr to about 20 Torr.

5. The method of claim 1, wherein the tungsten film grows at a rate in the range of about 0.2 Å/cycle and about 3 Å/cycle.

6. The method of claim 1, wherein sequentially exposing at least a portion of the substrate to the first reactive gas and the hydrogen radicals in the second reactive gas comprises moving the substrate relative to the gas distribution assembly so that each portion of the substrate is exposed to a flow of gases consisting essentially of, in order, the first reactive gas and the hydrogen radicals.

7. A processing method comprising sequentially exposing at least a portion of substrate in a processing chamber to a first reactive gas comprising a tungsten-containing compound having the empirical formula $WCl_5$ or $WCl_6$ and a second reactive gas comprising hydrogen radicals to form a tungsten-containing film, wherein the first reactive gas and the second reactive gas are flowed into the processing chamber at the same time, the first reactive gas and the second reactive gas are flowed into the processing chamber through a gas distribution assembly comprising adjacent elongate gas ports, the first reactive gas and the second reactive gas flowing through different elongate gas ports being separated by at least one of a purge gas port and a vacuum port.

8. The method of claim 7, further comprising generating the hydrogen radicals from hydrogen gas.

9. The method of claim 8, wherein generating the hydrogen radicals from hydrogen gas comprises passing the hydrogen gas across a heating element having a temperature sufficient to create hydrogen radicals.

10. The method of claim 9, further comprising heating the heating element to the temperature sufficient to create hydrogen radicals.

11. The method of claim 10, wherein heating the heating element comprises providing a flow of electrical current through the heating element.

12. The method of claim 10, further comprising applying dynamic tension to ends of the heating element to prevent the heating element from sagging at the temperature sufficient to create hydrogen radicals.

13. The method of claim 10, wherein the heating element is contained within an enclosure substantially resistant to thermal expansion.

14. The method of claim 7, wherein the heating element is positioned within the second reactive gas port.

15. The method of claim 7, wherein the heating element is contained within an enclosure substantially resistant to thermal expansion.

16. The method of claim 15, wherein the enclosure is affixed to a front surface of gas distribution assembly so that the second reactive gas flowing from the second reactive gas ports flows through the enclosure and around the heating element.

17. The method of claim 16, further comprising moving the substrate relative to the gas distribution assembly so that each portion of the substrate is exposed to a flow of gases consisting essentially of, in order, the first reactive gas and the second reactive gas.

18. The method of claim 7, wherein the substrate is maintained at a temperature less than about 475° C.

* * * * *